(12) United States Patent
Huang et al.

(10) Patent No.: US 12,382,654 B2
(45) Date of Patent: *Aug. 5, 2025

(54) SEMICONDUCTOR DEVICES

(71) Applicant: Taiwan Semiconductor Manufacturing Co., Ltd., Hsinchu (TW)

(72) Inventors: Yu-Lien Huang, Jhubei (TW); Guan-Ren Wang, Hsinchu (TW); Ching-Feng Fu, Taichung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/656,134

(22) Filed: May 6, 2024

(65) Prior Publication Data

US 2024/0290887 A1 Aug. 29, 2024

Related U.S. Application Data

(60) Continuation of application No. 17/872,825, filed on Jul. 25, 2022, now Pat. No. 12,009,429, which is a (Continued)

(51) Int. Cl.
*H10D 30/62* (2025.01)
*H10D 30/01* (2025.01)
(Continued)

(52) U.S. Cl.
CPC ........... *H10D 30/62* (2025.01); *H10D 30/024* (2025.01); *H10D 30/6219* (2025.01);
(Continued)

(58) Field of Classification Search
CPC ..... H01L 21/823418; H01L 21/823814; H01L 21/823431; H01L 21/823821;
(Continued)

(56) References Cited

U.S. PATENT DOCUMENTS 9,105,490 B2 8/2015 Wang et al.
9,236,267 B2 1/2016 De et al.
(Continued)

FOREIGN PATENT DOCUMENTS

CN 106252351 A 12/2016
CN 107026086 A 8/2017
(Continued)

*Primary Examiner* — Bac H Au
(74) *Attorney, Agent, or Firm* — Slater Matsil, LLP

(57) ABSTRACT

In an embodiment, a structure includes: a gate stack over a channel region of a substrate; a source/drain region adjacent the channel region; a first inter-layer dielectric (ILD) layer over the source/drain region; a silicide between the first ILD layer and the source/drain region, the silicide contacting a top surface of the source/drain region and a bottom surface of the source/drain region; and a first source/drain contact having a first portion and a second portion, the first portion of the first source/drain contact disposed between the silicide and the first ILD layer, the second portion of the first source/drain contact extending through the first ILD layer and contacting the silicide.

20 Claims, 21 Drawing Sheets

Related U.S. Application Data division of application No. 16/889,028, filed on Jun. 1, 2020, now Pat. No. 11,888,064.

(51) Int. Cl.
*H10D 64/66* (2025.01)
*H10D 84/01* (2025.01)
*H10D 84/03* (2025.01)

(52) U.S. Cl.
CPC ....... *H10D 64/668* (2025.01); *H10D 84/0137* (2025.01); *H10D 84/0193* (2025.01); *H10D 84/038* (2025.01)

(58) Field of Classification Search
CPC ............ H01L 29/41791; H10D 84/038; H10D 84/0149; H10D 84/013; H10D 84/017; H10D 84/0186; H10D 84/0193; H10D 84/0158; H10D 30/024; H10D 30/6219; H10D 30/797
See application file for complete search history.

(56) References Cited

U.S. PATENT DOCUMENTS

| | | | |
|---|---|---|---|
| 9,236,300 B2 | 1/2016 | Liaw | |
| 9,312,354 B2 | 4/2016 | Liu et al. | |
| 9,406,804 B2 | 8/2016 | Huang et al. | |
| 9,443,769 B2 | 9/2016 | Wang et al. | |
| 9,520,482 B1 | 12/2016 | Chang et al. | |
| 9,548,366 B1 | 1/2017 | Ho et al. | |
| 9,576,814 B2 | 2/2017 | Wu et al. | |
| 9,607,838 B1 | 3/2017 | Lin et al. | |
| 9,831,183 B2 | 11/2017 | Lin et al. | |
| 9,831,346 B1 | 11/2017 | Zang et al. | |
| 9,859,386 B2 | 1/2018 | Ho et al. | |
| 9,865,698 B2 | 1/2018 | Yu et al. | |
| 10,164,053 B1 | 12/2018 | Chung et al. | |
| 10,566,246 B1 | 2/2020 | Wu et al. | |
| 10,686,074 B2 | 6/2020 | Tsai et al. | |
| 10,840,139 B2 | 11/2020 | Seong et al. | |
| 10,854,716 B2 | 12/2020 | Wang et al. | |
| 12,009,429 B2 * | 6/2024 | Huang | H01L 29/4975 |
| 2014/0217517 A1 | 8/2014 | Cai et al. | |
| 2015/0303118 A1 | 10/2015 | Wang et al. | |
| 2016/0087053 A1 | 3/2016 | Kim et al. | |
| 2016/0141417 A1 | 5/2016 | Park et al. | |
| 2016/0284806 A1 | 9/2016 | Park et al. | |
| 2016/0351570 A1 | 12/2016 | Park et al. | |
| 2017/0053916 A1 | 2/2017 | Ching et al. | |
| 2017/0110578 A1 | 4/2017 | Okuno et al. | |
| 2017/0222008 A1 | 8/2017 | Hsu et al. | |
| 2017/0278743 A1 | 9/2017 | Tsai et al. | |
| 2018/0151683 A1 | 5/2018 | Yeo et al. | |
| 2019/0097006 A1 | 3/2019 | Li et al. | |
| 2019/0097051 A1 | 3/2019 | Tsai et al. | |
| 2019/0165124 A1 | 5/2019 | More et al. | |
| 2019/0172752 A1 | 6/2019 | Hsu et al. | |
| 2019/0273023 A1 | 9/2019 | Loh et al. | |
| 2019/0312143 A1 | 10/2019 | Lin et al. | |
| 2019/0333820 A1 | 10/2019 | Chang et al. | |
| 2019/0348415 A1 | 11/2019 | Sung et al. | |
| 2019/0371898 A1 | 12/2019 | Huang | |
| 2020/0006159 A1 | 1/2020 | Shih et al. | |
| 2020/0044025 A1 | 2/2020 | Liu et al. | |
| 2020/0075417 A1 | 3/2020 | Lee et al. | |
| 2021/0020522 A1 | 1/2021 | Shih et al. | |

FOREIGN PATENT DOCUMENTS

| | | |
|---|---|---|
| CN | 110416304 A | 11/2019 |
| KR | 20180079255 A | 7/2018 |
| KR | 20190063360 A | 6/2019 |
| KR | 20200014253 A | 2/2020 |
| TW | 201533911 A | 9/2015 |
| TW | 201913748 A | 4/2019 |
| TW | 201916178 A | 4/2019 |
| TW | 202002004 A | 1/2020 |
| TW | 202008434 A | 2/2020 |

* cited by examiner

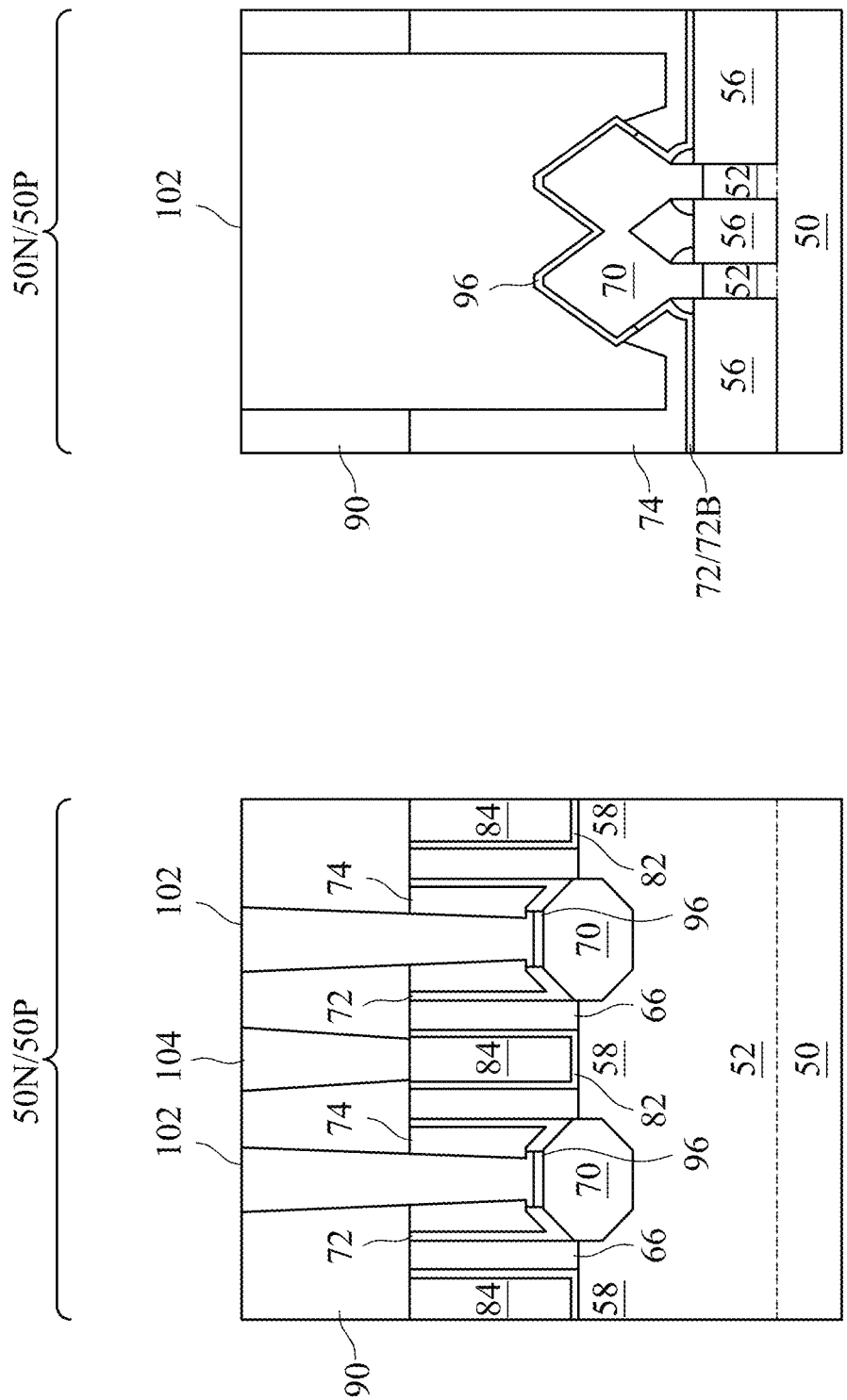

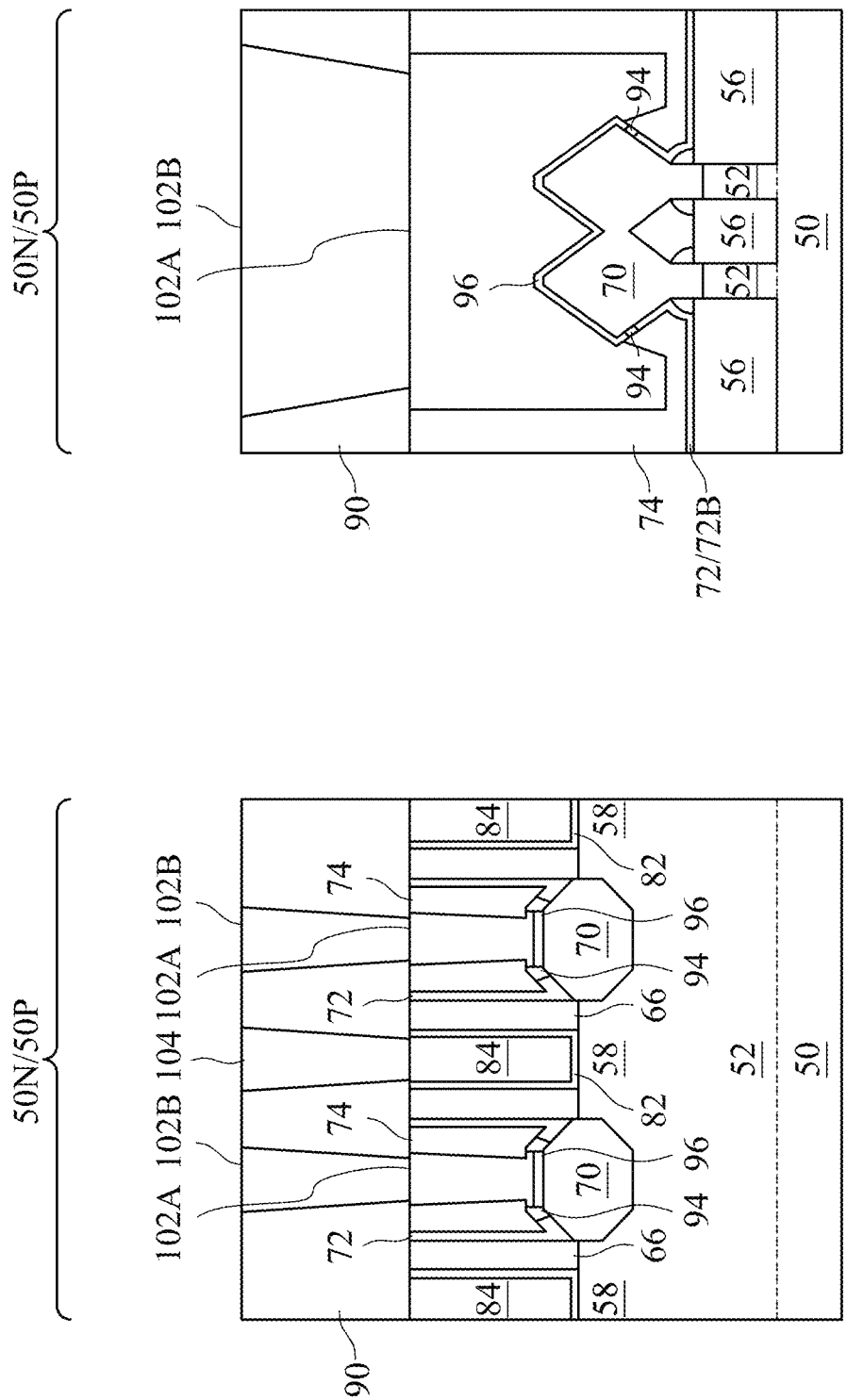

SEMICONDUCTOR DEVICES

PRIORITY CLAIM AND CROSS-REFERENCE

This application is a continuation of U.S. patent application Ser. No. 17/872,825, filed on Jul. 25, 2022, entitled "Semiconductor Device and Method," which is a divisional of U.S. patent application Ser. No. 16/889,028, filed on Jun. 1, 2020, entitled "Semiconductor Device and Method," now U.S. Pat. No. 11,888,064, issued on Jan. 30, 2024, which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 18A and 18B are cross-sectional views FinFETs, in accordance with some other embodiments.

FIGS. 21A and 21B are cross-sectional views FinFETs, in accordance with some other embodiments.

DETAILED DESCRIPTION

Figure 1:
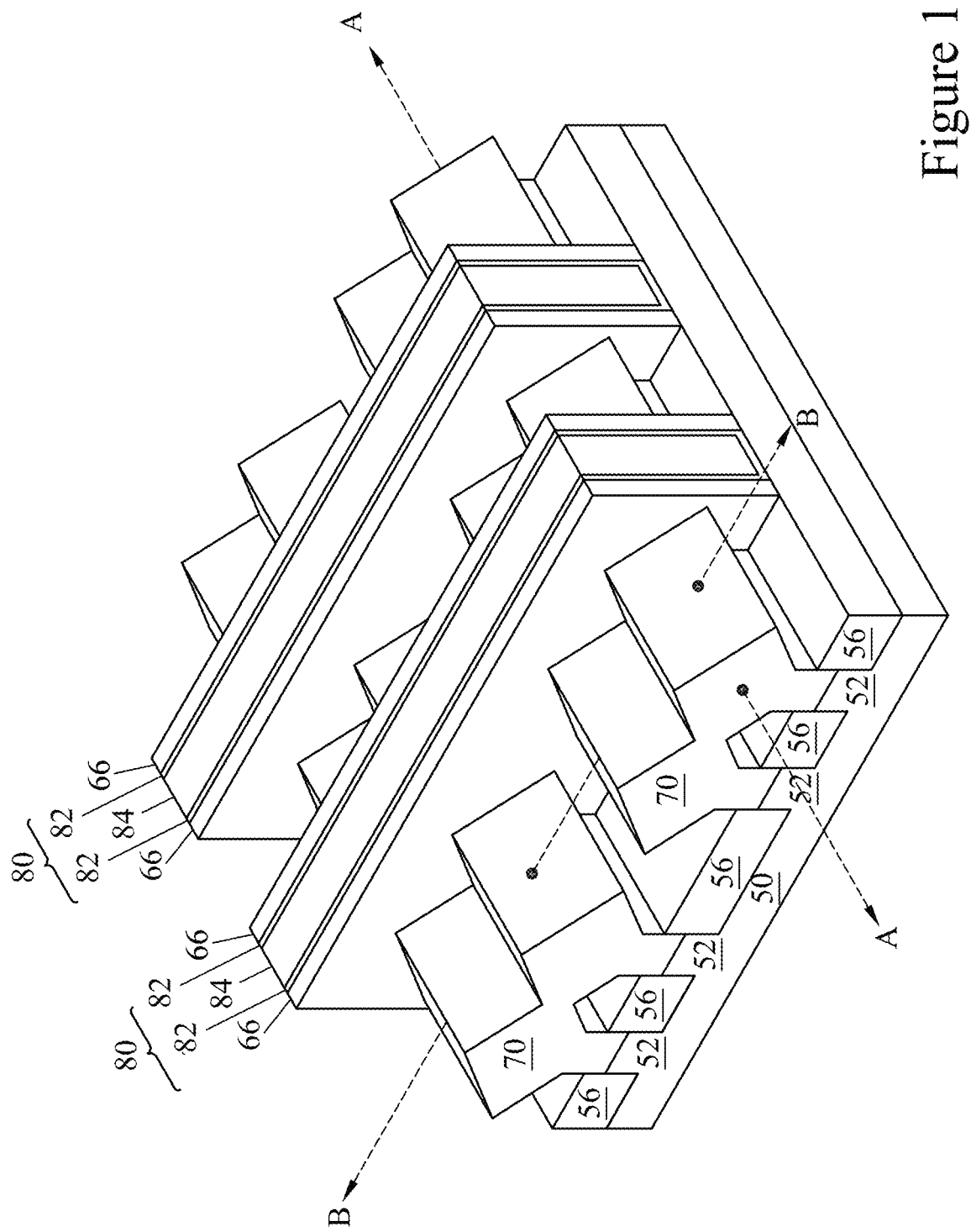
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, undercuts are formed in a contact etch stop layer (CESL), with the undercuts being disposed between source/drain regions and overlying inter-layer dielectric (ILD) layer(s). Forming the undercuts exposes surfaces of the source/drain regions, and thus allows silicides and contacts for the source/drain regions to contact a greater surface area of the source/drain regions. The contact resistance to the source/drain regions may thus be decreased, thereby improving performance of the resulting transistors.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically coupled in a manner to operate as, for example, one transistor or multiple transistors, such as four transistors.

The FinFETs include fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may include a single material or a plurality of materials. In this context, the fins 52 refers to the portions extending between the neighboring STI regions 56.

Gate structures 80 are over channel regions of the fins 52. The gate structures 80 include gate dielectrics 82 and gate electrodes 84. The gate dielectrics 82 are along sidewalls and over top surfaces of the fins 52, and the gate electrodes 84 are over the gate dielectrics 82. Source/drain regions 70 are disposed in opposite sides of the fins 52 with respect to the gate dielectrics 82 and gate electrodes 84. Gate spacers 66 separate the source/drain regions 70 from the gate structures 80. In embodiments where multiple transistors are formed, the source/drain regions 70 may be shared between various transistors. In embodiments where one transistor is formed from multiple fins 52, neighboring source/drain regions 70 may be electrically coupled, such as through coalescing the source/drain regions 70 by epitaxial growth, or through coupling the source/drain regions 70 with a same source/drain contact. One or more inter-layer dielectric (ILD) layer(s) (discussed further below) are over the source/drain regions 70 and/or gate electrodes 84, through which contacts (discussed further below) to the source/drain regions 70 and the gate electrodes 84 are formed.

FIG. 1 further illustrates several reference cross-sections. Cross-section A-A is along a longitudinal axis of a fin 52 and in a direction of, for example, a current flow between the source/drain regions 70 of a FinFET. Cross-section B-B is perpendicular to cross-section A-A and extends through source/drain regions 70 of the FinFETs. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
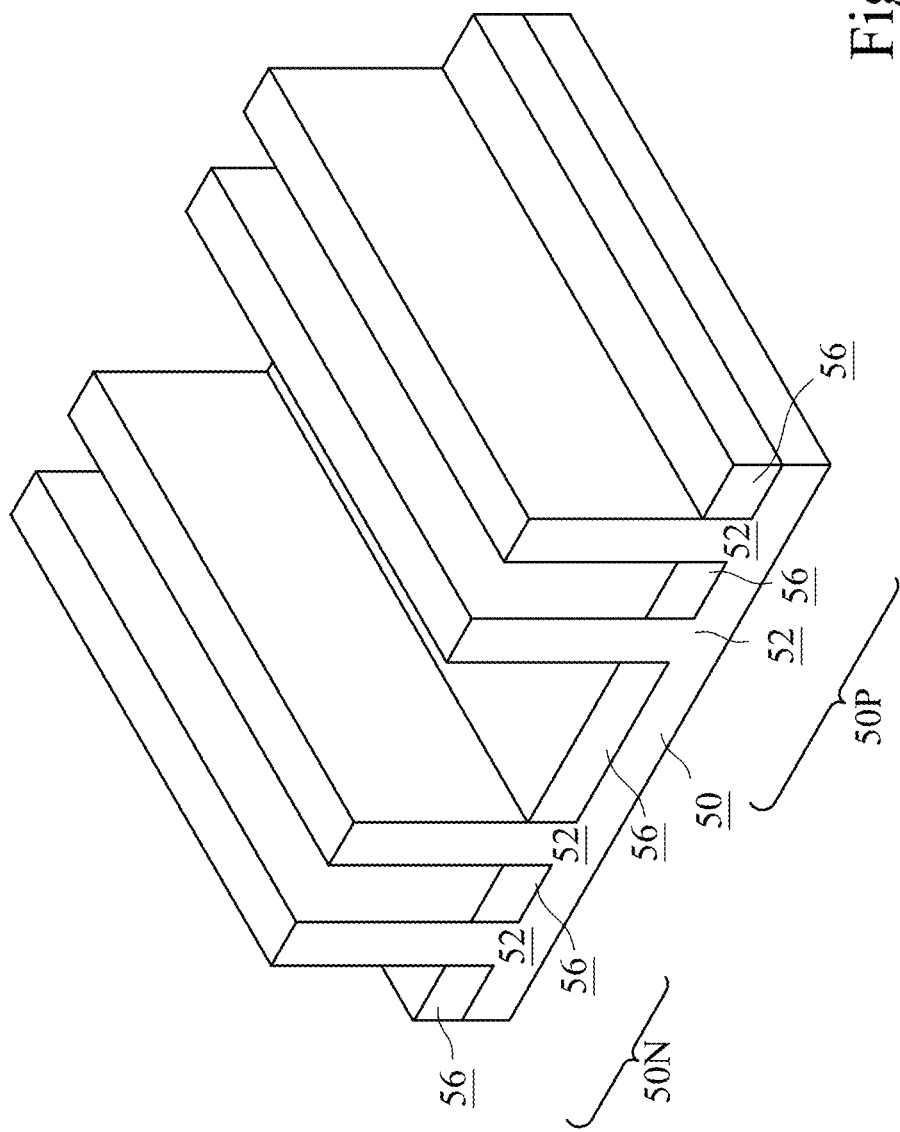
FIGS. 2 and 3 are three-dimensional views of intermediate stages in the manufacturing of FinFETs, in accordance with some embodiments.
Figure 3:
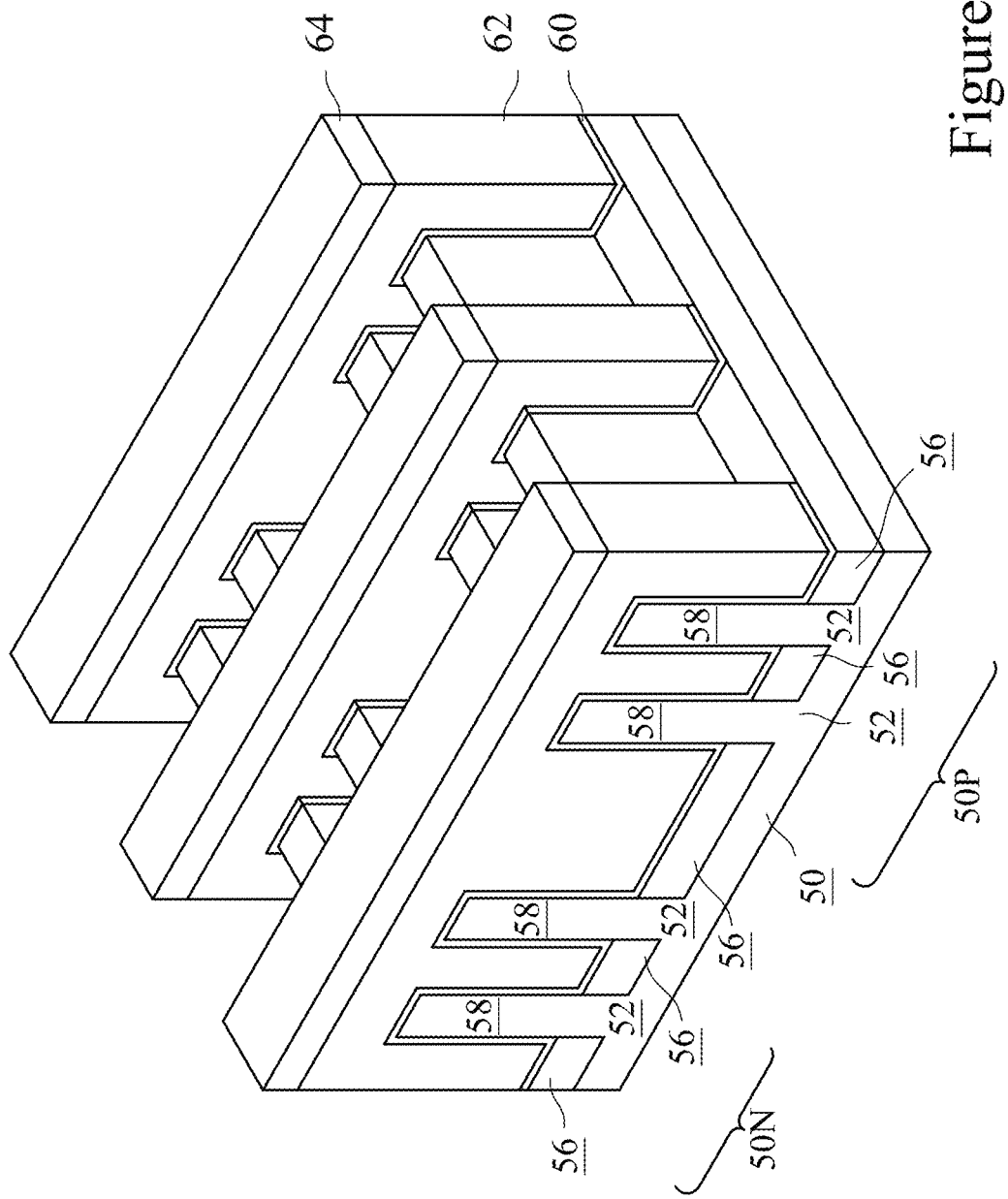

FIGS. 2 and 3 are three-dimensional views of intermediate stages in the manufacturing of FinFETs, in accordance with some embodiments. FIGS. 2 and 3 show a similar view as FIG. 1, except three gate structures are shown.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE) or the like. The etch may be anisotropic.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins. In some embodiments, the spacers (or other mask) may remain on the fins 52.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Although the STI regions 56 are illustrated as being single layered, some embodiments may utilize multiple layers. For example, in some embodiments a liner may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are coplanar after the planarization process is complete. In embodiments in which a mask remains on the fins 52, the planarization process may expose the mask or remove the mask such that top surfaces of the mask or the fins 52, respectively, and the insulation material are coplanar after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, an oxide removal using, for example, dilute hydrofluoric (dHF) acid may be used.

The process described above is just one example of how the fins 52 may be formed. In some embodiments, the fins 52 may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form the fins 52. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon-germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, indium arsenide, aluminum arsenide, gallium arsenide, indium phosphide, gallium nitride, indium gallium arsenide, indium aluminum arsenide, gallium antimonide, aluminum antimonide, aluminum phosphide, gallium phosphide, and the like.

Further, appropriate wells may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In embodiments with different well types, the different implant steps for the region 50N and the region 50P may be achieved using a photoresist or other masks. For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like, and can be implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, boron fluoride, indium, or the like, and can be implanted in the region to a concentration of equal to or less than $10^{18}$ cm$^{-3}$, such as in the range of about $10^{16}$ cm$^{-3}$ to about $10^{18}$ cm$^{-3}$. After the implant, the photoresist may be removed, such as by an acceptable ashing process.

After the implants of the region 50N and the region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy dielectrics 60 are formed over the fins 52 and dummy gates 62 are formed over the dummy dielectrics 60. The dummy dielectrics 60 and dummy gates 62 may be collectively referred to as "dummy gate stacks," with each dummy gate stack including a dummy dielectric 60 and a dummy gate 62. The dummy gate stacks extend along sidewalls of the fins 52.

As an example to form the dummy dielectrics 60 and the dummy gates 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing the selected material. The dummy gate layer may be made of other materials that have a high etching selectivity from the etching of the STI regions 56. The mask layer may include, for example, silicon nitride, silicon oxynitride, or the like. In this example, a single dummy gate layer and a single mask layer are formed across the region 50N and the region 50P. The mask layer is then patterned using acceptable photolithography and etching techniques to form masks 64. The pattern of the masks 64 is then transferred to the dummy gate layer by an acceptable etching technique to form the dummy gates 62. The pattern of the masks 64 may optionally be further transferred to the dummy dielectric layer to form the dummy dielectrics 60. The dummy gates 62 cover respective channel regions 58 of the fins 52. The pattern of the masks 64 may be used to physically separate each of the dummy gates 62 from adjacent dummy gates. The dummy gates 62 may also have a lengthwise direction substantially perpendicular (within process limitations) to the lengthwise direction of respective fins 52. Although the dummy dielectrics 60 are shown covering the STI regions 56, it should be appreciate that the dummy dielectrics 60 can be formed in other manners. In some embodiments, such as when the dummy dielectric layer is thermally grown, the dummy dielectrics 60 are formed to only cover the fins 52.

FIGS. 4A through 14B are cross-sectional views of further intermediate stages in the manufacturing of FinFETs, in accordance with some embodiments. FIGS. 4A, 5A, 6A, 7A, 8A, 9A, 10A, 11A, 12A, 13A, and 14A are cross-sectional views illustrated along reference cross-section A-A in FIG. 1, except three gate structures are shown. FIGS. 4B, 5B, 6B, 7B, 8B, 9B, 10B, 11B, 12B, 13B, and 14B are cross-sectional views illustrated along reference cross-section B-B in FIG. 1, except only two fins are shown. FIGS. 4A through 14B illustrate features in either of the region 50N and the region 50P. For example, the structures illustrated in FIGS. 4A through 14B may be applicable to both the region 50N and the region 50P. Differences (if any) in the structures of the region 50N and the region 50P are described herein.

Figure 4B:
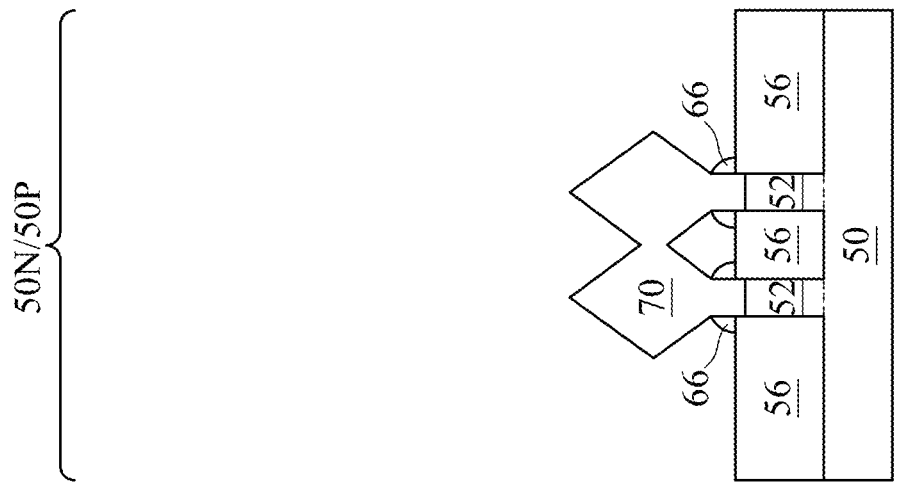
FIGS. 4A, 4B, 5A, 5B, 6A, 6B, 7A, 7B, 8A, 8B, 9A, 9B, 10A, 10B, 11A, 11B, 12A, 12B, 13A, 13B, 14A, and 14B are cross-sectional views of further intermediate stages in the manufacturing of FinFETs, in accordance with some embodiments.
Figure 4A:
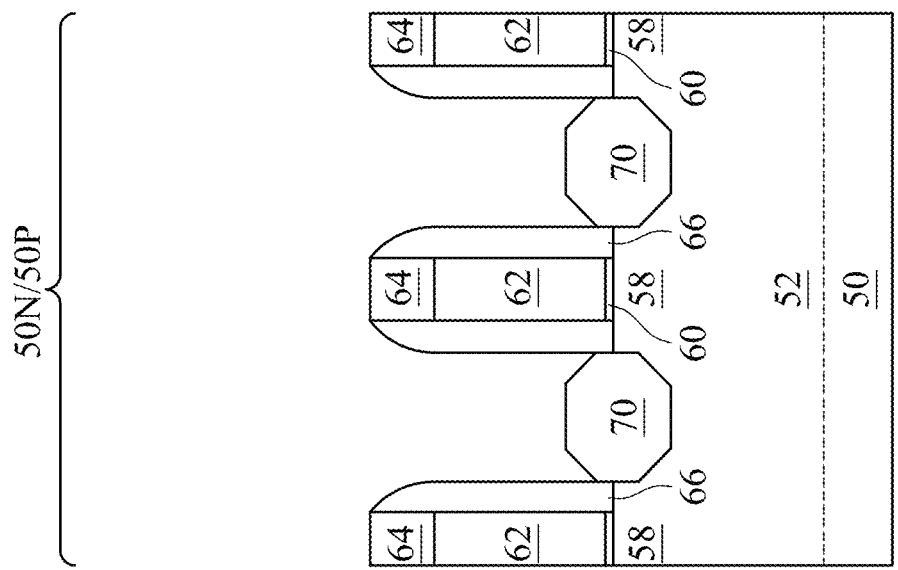

In FIGS. 4A and 4B, gate spacers 66 are formed on exposed surfaces of the dummy gates 62, the masks 64, and/or the fins 52. The gate spacers 66 may be formed by forming an insulating material and subsequently etching the insulating material. The insulating material of the gate spacers 66 may be silicon nitride, silicon carbonitride, silicon oxycarbonitride, a combination thereof, or the like, and may be formed by thermal oxidation, deposition, a combination thereof, or the like. In some embodiments, the gate spacers 66 are formed from a multi-layered insulating material, and include multiple layers. For example, the gate spacers 66 may include multiple layers of silicon carbonitride, may include multiple layers of silicon oxycarbonitride, or may include a layer of silicon oxide disposed between two layers of silicon nitride. The etching of the gate spacers 66 can be anisotropic. After the etching, the gate spacers 66 can have straight sidewalls or curved sidewalls.

Before or during the formation of the gate spacers 66, implants for lightly doped source/drain (LDD) regions (not explicitly illustrated) may be performed. In embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{19}$ cm$^{-3}$. An anneal may be used to repair implant damage and to activate the implanted impurities.

Epitaxial source/drain regions 70 are then formed in the fins 52. The epitaxial source/drain regions 70 are formed in the fins 52 such that each of the dummy gates 62 are disposed between respective neighboring pairs of the epitaxial source/drain regions 70. In some embodiments the epitaxial source/drain regions 70 may extend into portions of the fins 52 beneath the top surfaces of the STI regions 56. In some embodiments, the gate spacers 66 are used to separate the epitaxial source/drain regions 70 from the dummy gates 62 by an appropriate lateral distance so that the epitaxial source/drain regions 70 do not short out subsequently formed gates of the resulting FinFETs. The epitaxial source/drain regions 70 can exert stress in the channel regions 58 of the fins 52, thereby improving performance.

The epitaxial source/drain regions 70 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 70 in the region 50N are epitaxially grown in the recesses. The epitaxial source/drain regions 70 may include any acceptable material, such as appropriate for n-type FinFETs. For example, if the fins 52 are silicon, the epitaxial source/drain regions 70 in the region 50N may include materials exerting a tensile strain in the channel region 58, such as silicon, silicon carbide, phosphorous doped silicon carbide, silicon phosphide, or the like. The epitaxial source/drain regions 70 in the region 50N may have surfaces raised from respective surfaces of the fins 52 and may have facets.

The epitaxial source/drain regions 70 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 70 in the region 50P are epitaxially grown in the recesses. The epitaxial source/drain regions 70 may include any acceptable material, such as appropriate for p-type FinFETs. For example, if the fins 52 are silicon, the epitaxial source/drain regions 70 in the region 50P may comprise materials exerting a compressive strain in the channel region 58, such as silicon-germanium, boron doped silicon-germanium, germanium, germanium tin, or the like. The epitaxial source/drain regions 70 in the region 50P may also have surfaces raised from respective surfaces of the fins 52 and may have facets.

The epitaxial source/drain regions 70 and/or the fins 52 may be implanted with dopants to form source/drain regions, similar to the process previously discussed for forming lightly-doped source/drain regions, followed by an anneal. The source/drain regions may have an impurity concentration in the range of about $10^{19}$ cm$^{-3}$ to about $10^{21}$ cm$^{-3}$. The n-type and/or p-type impurities for source/drain regions may be any of the impurities previously discussed. In some embodiments, the epitaxial source/drain regions 70 may be in situ doped during growth.

As a result of the epitaxy processes used to form the epitaxial source/drain regions 70, upper surfaces of the epitaxial source/drain regions 70 have facets which expand laterally outward beyond sidewalls of the fins 52. In some embodiments, these facets cause adjacent epitaxial source/drain regions 70 of a same FinFET to merge as illustrated by FIG. 4B. For example, merged epitaxial source/drain regions 70 may be formed when one transistor is formed from multiple fins 52. In other embodiments, adjacent epitaxial source/drain regions 70 remain separated after the epitaxy process is completed. For example, unmerged epitaxial source/drain regions 70 may be formed when one transistor is formed from a single fin 52 or when one transistor is formed from multiple fins 52. In the embodiment illustrated, the gate spacers 66 are formed covering a portion of the sidewalls of the fins 52 that extend above the STI regions 56, thereby blocking the epitaxial growth. In some other embodiments, the spacer etch used to form the gate spacers 66 may be adjusted to remove the spacer material to allow the epitaxially grown region to extend to the surface of the STI regions 56.

It is noted that the above disclosure generally describes a process of forming spacers, LDD regions, and source/drain regions. Other processes and sequences may be used. For example, fewer or additional spacers may be utilized, different sequence of steps may be utilized, spacers may be formed and removed, and/or the like. In some embodiments, the gate spacers 66 can be formed after the epitaxial source/drain regions 70. Furthermore, the n-type and p-type devices may be formed using a different structures and steps. In some embodiments, dummy spacers can be formed in the region 50N during the formation of the epitaxial source/drain regions 70 in the region 50N. The dummy spacers in the region 50N can then be removed. Dummy spacers can then be formed in the region 50P during the formation of the epitaxial source/drain regions 70 in the region 50P. The dummy spacers in the region 50P can then be removed. The gate spacers 66 can then be formed after the epitaxial source/drain regions 70 have been formed in both the region 50N and the region 50P.

Figure 5B:
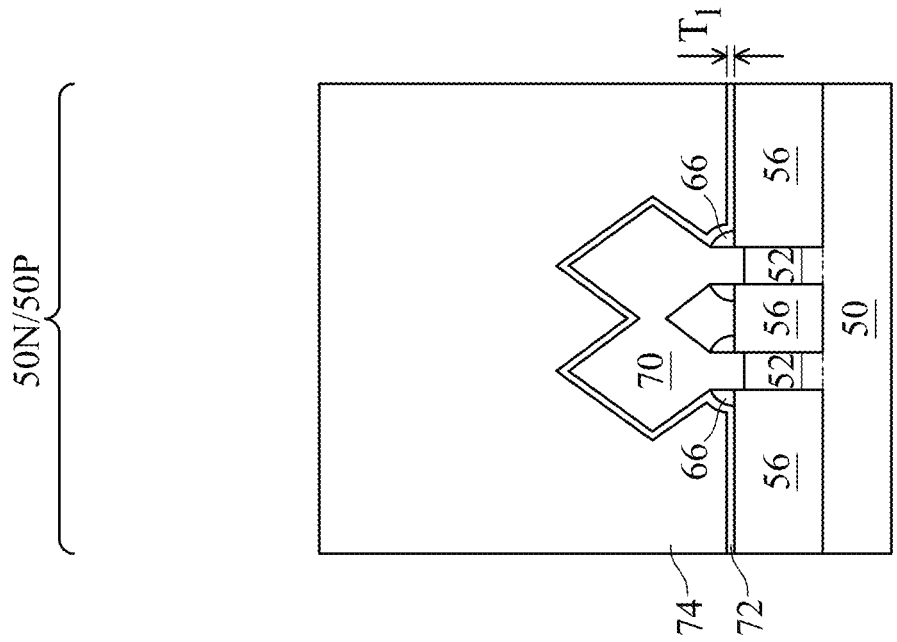
Figure 5A:
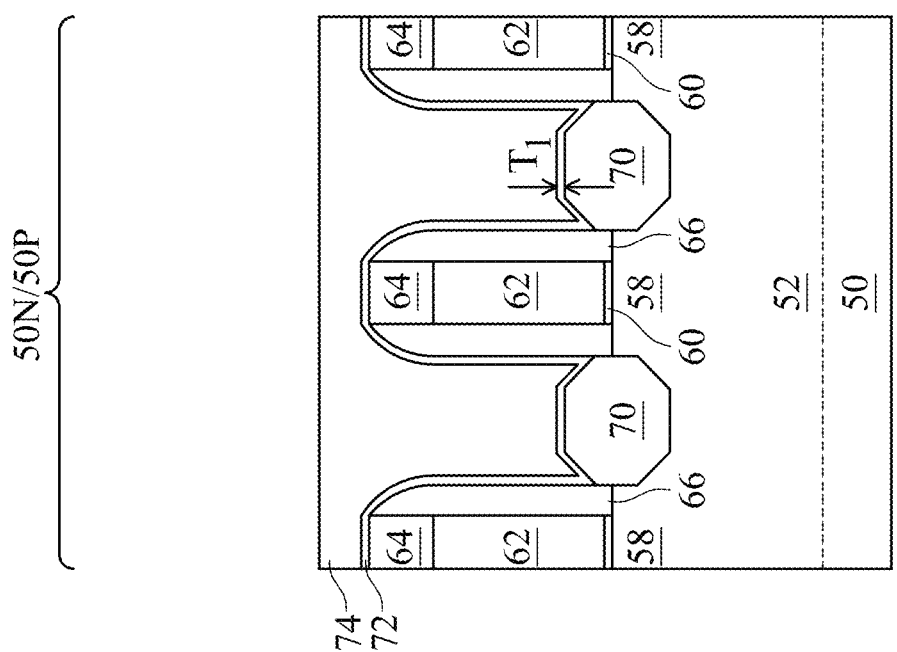

In FIGS. 5A and 5B, a CESL 72 is deposited over the epitaxial source/drain regions 70, the gate spacers 66, the masks 64 (if present) or the dummy gates 62, and the STI regions 56. The CESL 72 is formed of a dielectric material, such as silicon nitride, silicon oxide, silicon oxynitride, or the like. In an embodiment, the CESL 72 is formed of silicon nitride.

A first ILD layer 74 is then deposited over the CESL 72. The first ILD layer 74 is formed of a dielectric material having a different etch rate than the material of the CESL 72, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. Other insulation materials formed by any acceptable process may be used. After formation, the first ILD layer 74 can be planarized, such as by a CMP.

The CESL 72 is formed to a large thickness $T_1$, such as a thickness $T_1$ in the range of about 3 nm to about 10 nm. As discussed further below, undercuts will be formed in the CESL 72, between the epitaxial source/drain regions 70 and the first ILD layer 74. Subsequently formed source/drain contacts will be formed extending into the undercuts, thereby increasing the contact surface area of the epitaxial source/drain regions 70. Forming the CESL 72 to a large thickness $T_1$ helps provide sufficient room for the subsequent formation of the source/drain contacts.

Figure 6B:
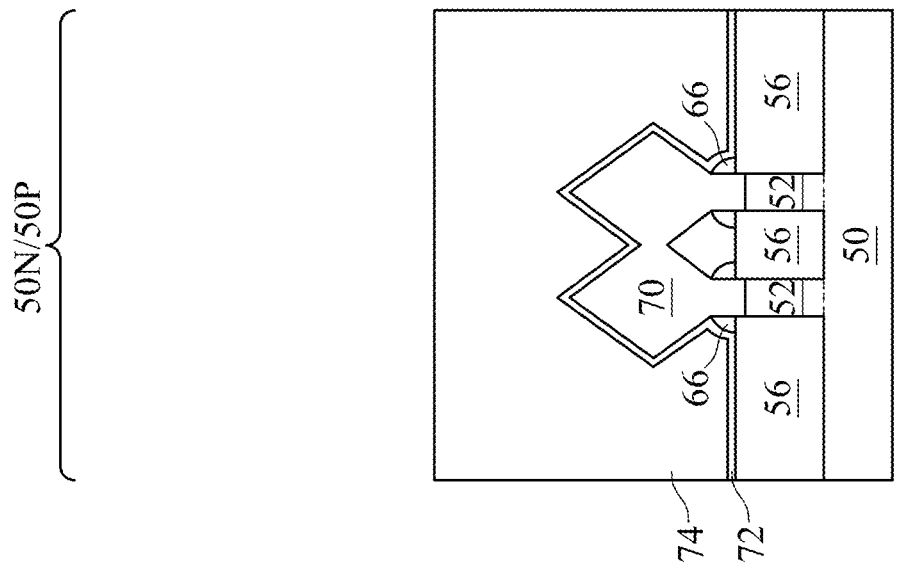
Figure 6A:
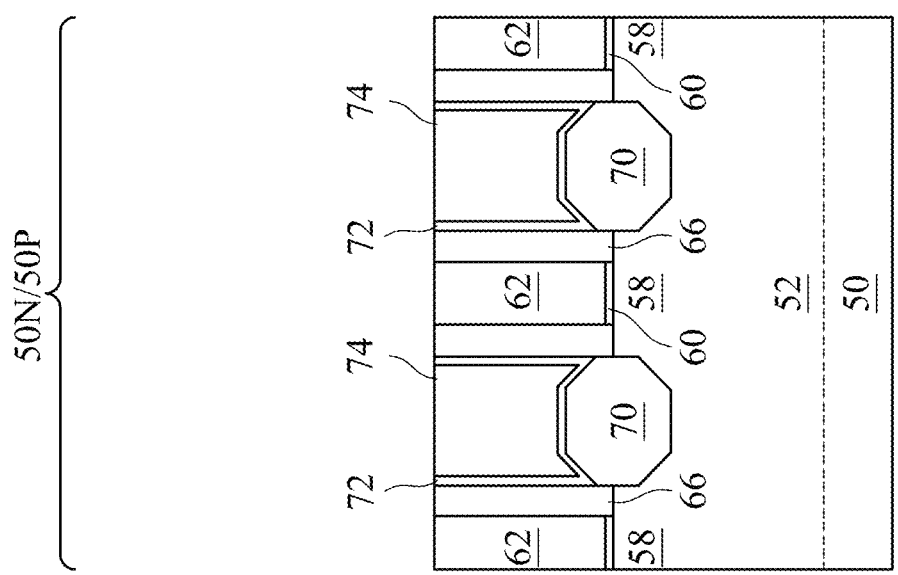

In FIGS. 6A and 6B, a planarization process, such as a CMP, may be performed to level the top surface of the first ILD layer 74 with the top surfaces of the masks 64 (if present) or the dummy gates 62. The planarization process can remove the masks 64 on the dummy gates 62 and portions of the gate spacers 66 along sidewalls of the masks 64. The planarization process can also remove portions of the CESL 72 over the dummy gates 62 and the gate spacers 66. After the planarization process, top surfaces of the dummy gates 62, the gate spacers 66, the CESL 72, and the first ILD layer 74 are coplanar. Accordingly, the top surfaces of the dummy gates 62 are exposed through the first ILD layer 74. In some embodiments, the masks 64 may remain, in which case the planarization process levels the top surface of the first ILD layer 74 with the top surfaces of the masks 64.

Figure 7B:
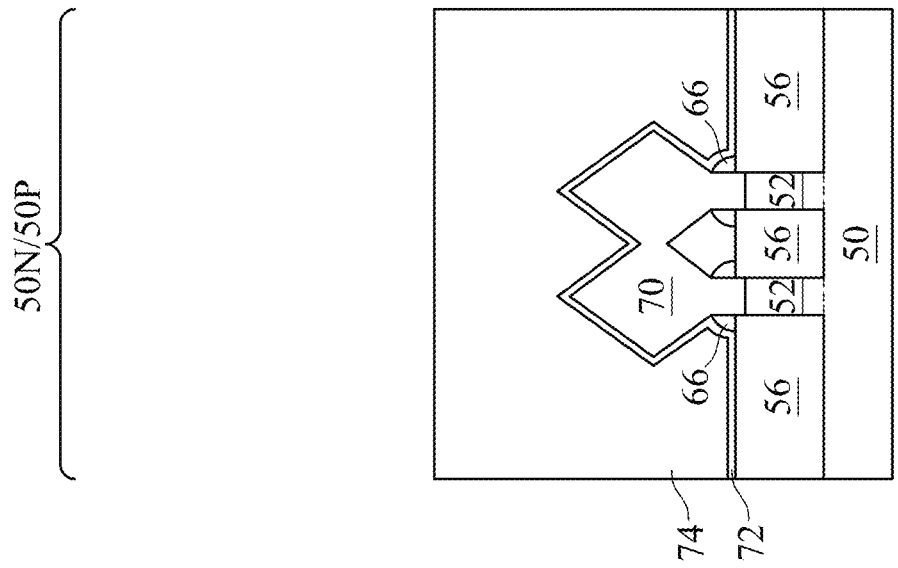
Figure 7A:
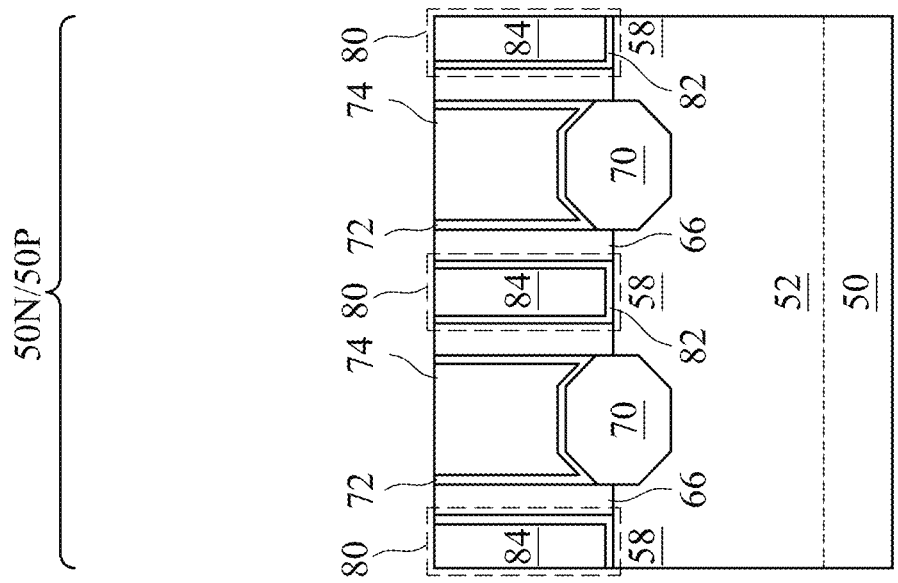

In FIGS. 7A and 7B, the dummy gates 62 and optionally the dummy dielectrics 60 are removed and are replaced with gate structures 80. The gate structures 80 include gate dielectrics 82 and gate electrodes 84. As an example to form the gate structures 80, the dummy gates 62 and the masks 64 (if present) are removed in one or more etching step(s), so that recesses are formed. Portions of the dummy dielectrics 60 in the recesses may also be removed. In some embodiments, only the dummy gates 62 are removed and the dummy dielectrics 60 remain and are exposed by the recesses. In some embodiments, the dummy dielectrics 60 are removed from recesses in a first region of a die (e.g., a core logic region) and remain in recesses in a second region of the die (e.g., an input/output region). In some embodiments, the dummy gates 62 are removed by an anisotropic dry etch process. For example, the etching process may include a dry etch process using reaction gas(es) that selectively etch the dummy gates 62 without etching the first ILD layer 74, the CESL 72, or the gate spacers 66. Each recess exposes and/or overlies a channel region 58 of a respective fin 52. Each channel region 58 is disposed between neighboring pairs of the epitaxial source/drain regions 70. During the removal, the dummy dielectrics 60 may be used as etch stop layers when the dummy gates 62 are etched. The dummy dielectrics 60 may then be optionally removed after the removal of the dummy gates 62. After the removal, the gate dielectrics 82 are deposited conformally in the recesses, such as on the top surfaces and the sidewalls of the fins 52 and on sidewalls of the gate spacers 66. The gate dielectrics 82 may also be formed on top surface of the first ILD layer 74. In accordance with some embodiments, the gate dielectrics 82 comprise silicon oxide, silicon nitride, or multilayers thereof. In some embodiments, the gate dielectrics 82 include a high-k dielectric material, and in these embodiments, the gate dielectrics 82 may have a k value greater than about 7.0, and may include a metal oxide or a silicate of hafnium, aluminum, zirconium, lanthanum, manganese, barium, titanium, lead, and combinations thereof. The formation methods of the gate dielectrics 82 may include molecular-beam deposition (MBD), atomic layer deposition (ALD), PECVD, and the like. In embodiments where portions of the dummy dielectrics 60 remain in the recesses, the gate dielectrics 82 include a material of the dummy dielectrics 60 (e.g., silicon oxide). The gate electrodes 84 are deposited over the gate dielectrics 82, respectively, and fill the remaining portions of the recesses. The gate electrodes 84 may include a metal-containing material such as titanium nitride, titanium oxide, tantalum nitride, tantalum carbide, cobalt, ruthenium, aluminum, tungsten, combinations thereof, or multi-layers thereof. For example, although a single-layer gate electrode 84 is illustrated, each gate electrode 84 may comprise any number of liner layers, any number of work function tuning layers, and a fill material. After the filling of the gate electrodes 84, a planarization process, such as a CMP, may be performed to remove the excess portions of the gate dielectrics 82 and the material of the gate electrodes 84, which excess portions are over the top surface of the first ILD layer 74. The remaining portions of material of the gate electrodes 84 and the gate dielectrics 82 form the gate structures 80 of the resulting FinFETs. The gate structures 80 may be also referred to as "gate stacks" or "metal gates." The gate structures 80 may extend along sidewalls of the channel regions 58 of the fins 52.

The formation of the gate structures 80 in the region 50N and the region 50P may occur simultaneously such that the gate dielectrics 82 in each region are formed from the same materials and the gate electrodes 84 in each region are formed from the same materials. In some embodiments, the gate structures 80 in each region may be formed by distinct processes, such that the gate dielectrics 82 in each region may be different materials and the gate electrodes 84 in each region may be different materials. Various masking steps may be used to mask and expose appropriate regions when using distinct processes.

Figure 8B:
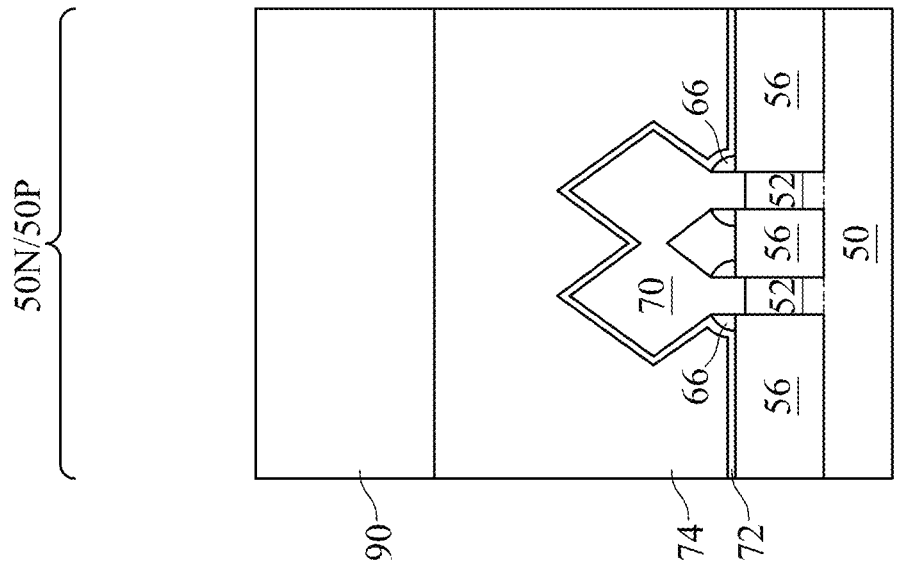
Figure 8A:
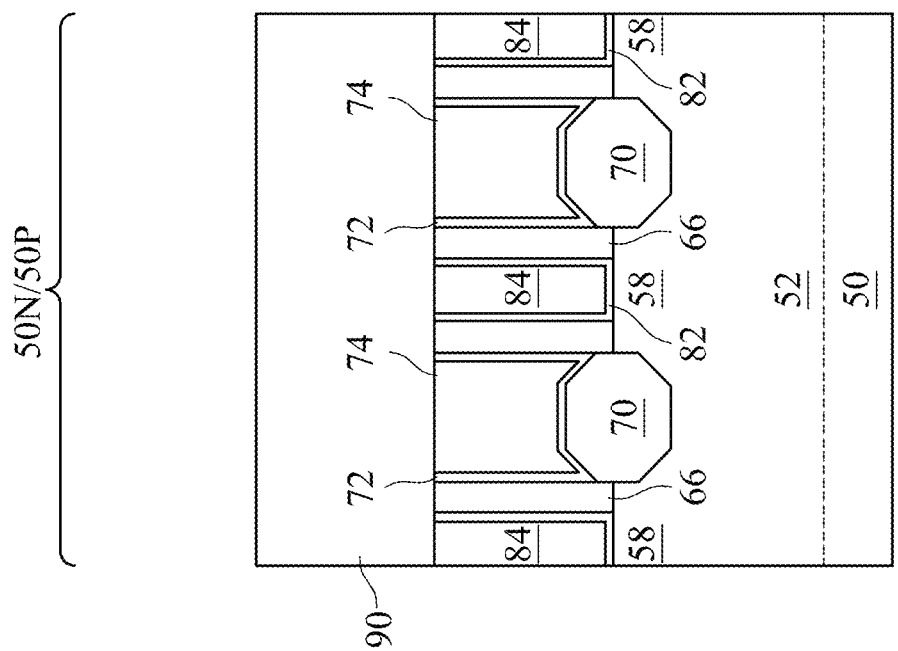

In FIGS. 8A and 8B, a second ILD layer 90 is deposited over the first ILD layer 74. The second ILD layer 90 may be formed of a dielectric material, and may be deposited by any suitable method, such as CVD, plasma-enhanced CVD (PECVD), or FCVD. Dielectric materials may include oxides such as silicon oxide, phosphosilicate glass (PSG), borosilicate glass (BSG), boron-doped phosphosilicate glass (BPSG), undoped Silicate Glass (USG), or the like; nitrides such as silicon nitride; or the like. After formation, the second ILD layer 90 can be planarized, such as by a CMP. In some embodiments, an etch stop layer is formed between the first ILD layer 74 and the second ILD layer 90. The etch stop layer may comprise a dielectric material, such as silicon nitride, silicon oxide, silicon oxynitride, or the like, having a different etch rate than the material of the second ILD layer 90. In some embodiments, before the formation of the second ILD layer 90, gate masks can be formed over the gate dielectrics 82 and gate electrodes 84, which may protect the gate dielectrics 82 and gate electrodes 84 during contact formation.

Figures 9A, 9B:
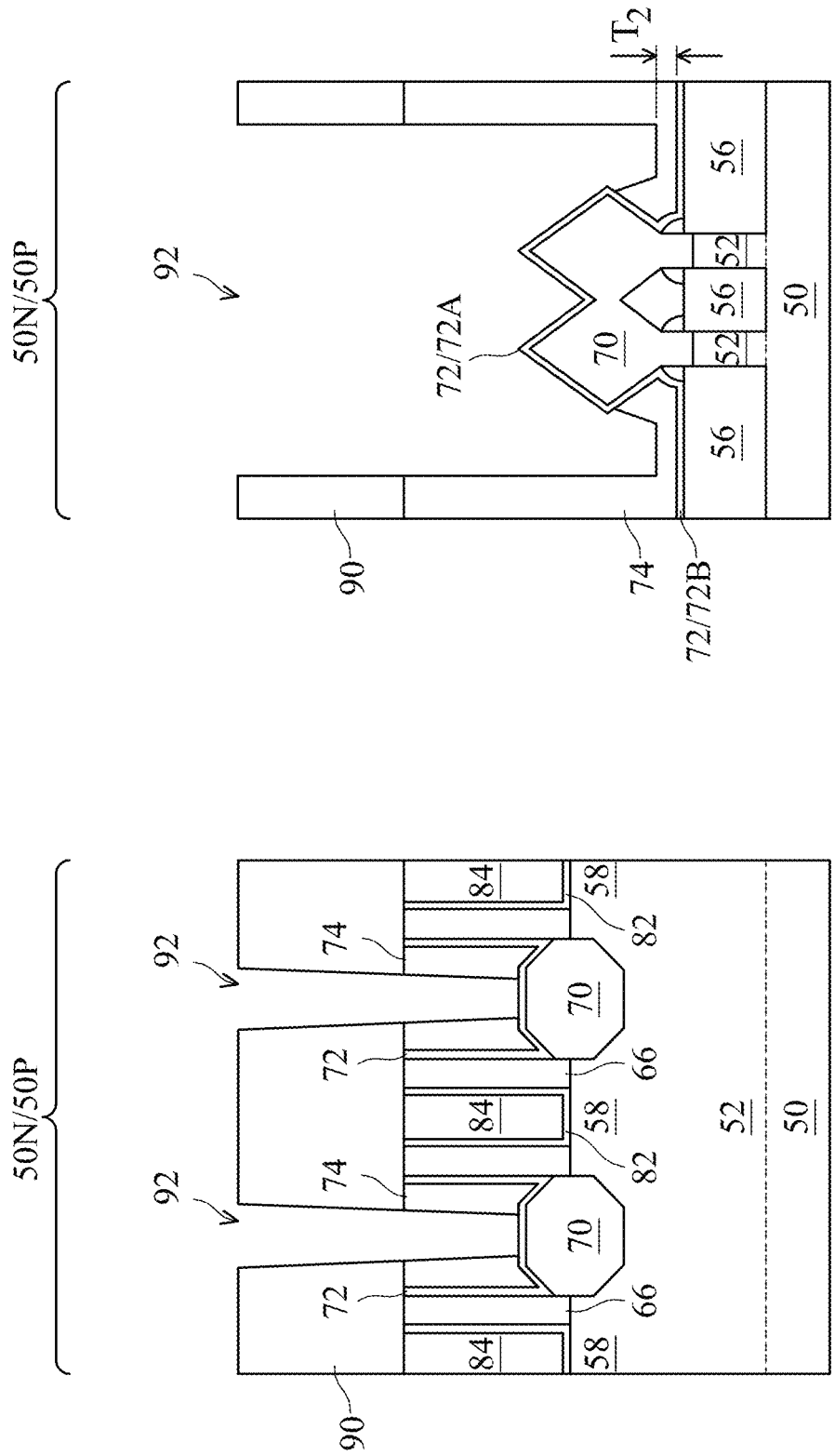

In FIGS. 9A and 9B, source/drain contact openings 92 are formed through the ILD layers 74, 90. The source/drain contact openings 92 may be formed using acceptable photolithography and etching techniques. The etching may be performed by a dry etch that is selective to the material of the ILD layers 74, 90 (e.g., etches the material of the ILD layers 74, 90 at a faster rate than the material of the CESL 72). Thus, the CESL 72 stops the etching of the source/drain contact openings 92. For example, when the ILD layers 74, 90 are formed of silicon oxide, the etch can be a dry (e.g., plasma) etch, such as a reactive ion etch (RIE), and can be performed using one or more reaction gas(es) such as hexafluoro-1,3-butadiene ($C_4F_6$), octafluorocyclopentene ($C_5F_8$), octafluorocyclobutane ($C_4F_8$), or the like. A plasma can be generated during the etch with $H_2$, $O_2$, $CO_2$, or the like. As shown by the cross-section of FIG. 9B, the source/drain contact openings 92 expose first portions of the CESL 72A, e.g., portions over the epitaxial source/drain regions 70, but do not expose second portions of the CESL 72B, e.g., portions beneath the epitaxial source/drain regions 70 and on the STI regions 56. Notably, some portions of the first ILD layer 74 remain over the second portions of the CESL 72B. The portions of the first ILD layer 74 remaining over the second portions of the CESL 72B have a thickness $T_2$, which can be in the range of about 0 nm to about 50 nm. Leaving some portions of the first ILD layer 74 at the bottoms of the source/drain contact openings 92 can help protect the STI regions 56 during a subsequent process for forming undercuts in the CESL 72.

Figure 10B:
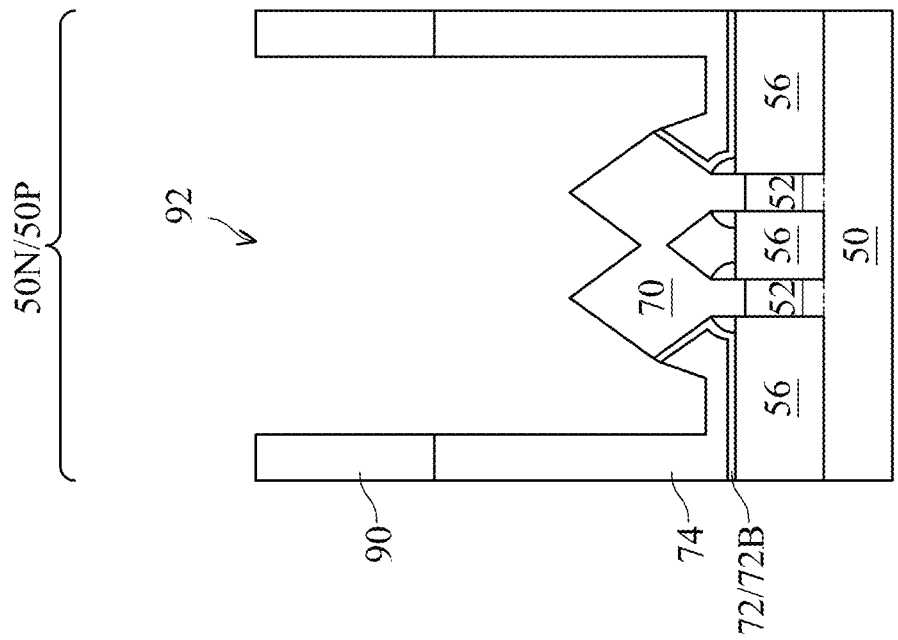
Figure 10A:
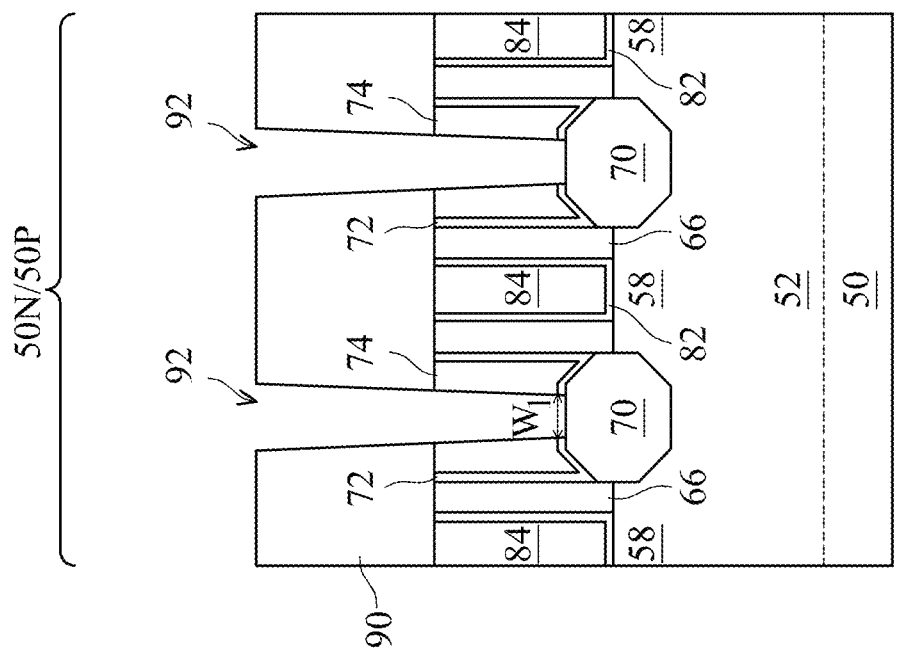

In FIGS. 10A and 10B, the CESL 72 is opened, thus exposing the epitaxial source/drain regions 70. The CESL 72 is opened by extending the source/drain contact openings 92 through the CESL 72 with an etching process. As shown by the cross-section of FIG. 10A, after the etching, the source/drain contact openings 92 in the CESL 72 have a width $W_1$, which can be in the range of about 8 nm to about 200 nm. As shown by the cross-section of FIG. 10B, the second portions of the CESL 72B are not removed by the etch, but the first portions of the CESL 72A (see FIG. 9B) are removed. Thus, after the etching, the top surfaces of the epitaxial source/drain regions 70 are exposed, but the bottom surfaces of the epitaxial source/drain regions 70 are not exposed.

The etching process for opening the CESL 72 is different from (e.g., is performed with different etching parameters, different etchants, and/or a different type of etching than) the etching process for forming the source/drain contact openings 92 through the ILD layers 74, 90 discussed with respect to FIGS. 9A and 9B. The etching may be a wet or dry etch that is selective to the material of the CESL 72 (e.g., etches the material of the CESL 72 at a faster rate than the material of the ILD layers 74, 90). As noted above, the CESL 72 is formed to a large thickness $T_1$ (see FIG. 5A). As such, in some embodiments, the etch can be an anisotropic etch. For example, when the CESL 72 is formed of silicon nitride, the etch can be a dry (e.g., plasma) etch, such as a reactive ion etch (RIE), and can be performed using one or more reaction gas(es) such as fluoromethane ($CH_3F$) or the like. A plasma can be generated during the etch with $H_2$, $O_2$, $CO_2$, or the like.

Figure 11B:
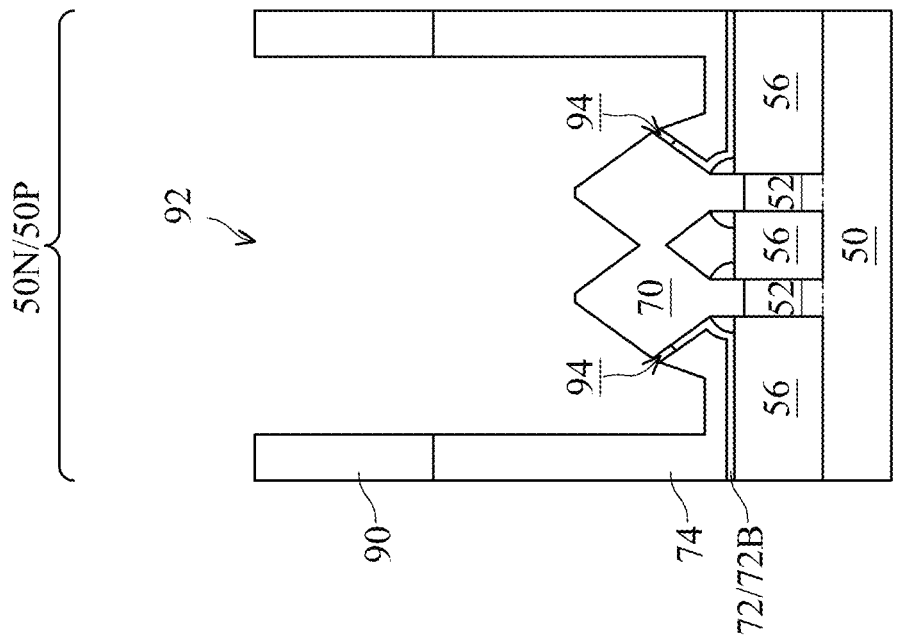
Figure 11A:
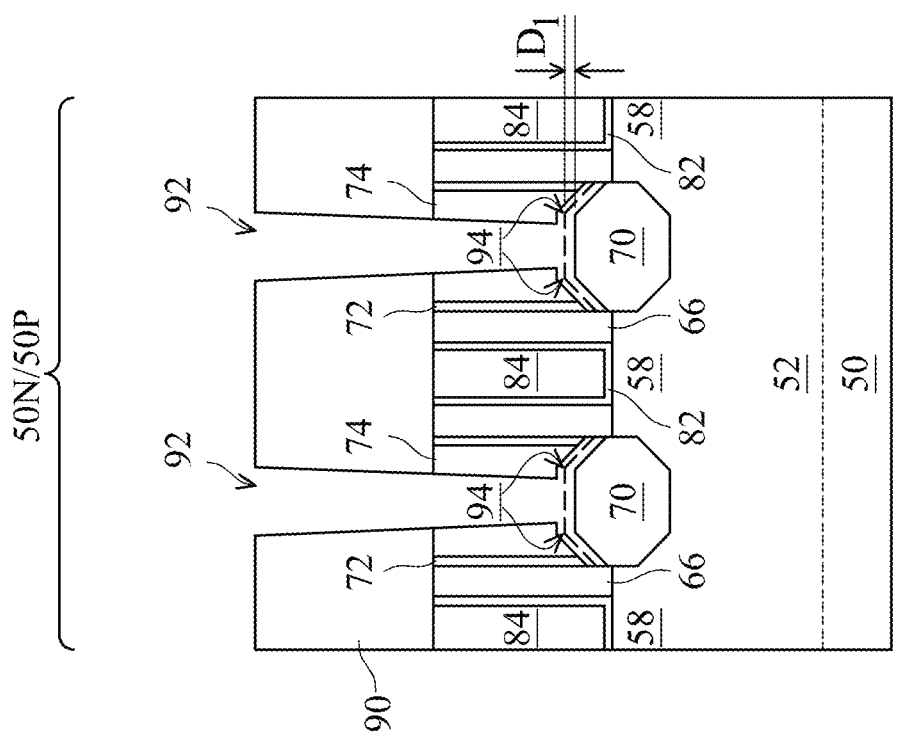

In FIGS. 11A and 11B, the lower portions of the source/drain contact openings 92 are laterally expanded (e.g., widened), thus forming undercuts 94 (e.g., voids) between the epitaxial source/drain regions 70 and the first ILD layer 74. The surface area of the epitaxial source/drain regions 70 exposed by the source/drain contact openings 92 is thus increased. Subsequently formed source/drain contacts will be formed extending at least partially into the undercuts 94, thereby increasing the contact surface area of the epitaxial source/drain regions 70. As shown by the cross-section of FIG. 11A the undercuts 94 can expose portions of the sidewalls of the gate spacers 66. As shown by the cross-section of FIG. 11B, the second portions of the CESL 72B are etched to form the undercuts 94 at least partially beneath the epitaxial source/drain regions 70. Thus, after the etching, portions of the bottom surfaces of the epitaxial source/drain regions 70 are exposed.

The etching process for laterally expanding (e.g., widening) the lower portions of the source/drain contact openings 92 is different from (e.g., is performed with different etching parameters, different etchants, and/or a different type of etching than) the etching process for opening the CESL 72 discussed with respect to FIGS. 10A and 10B. The etching may be a wet or dry etch that is selective to the material of the CESL 72 (e.g., etches the material of the CESL 72 at a faster rate than the material of the ILD layers 74, 90). In some embodiments, the etch is an isotropic etch (or at least etches the CESL 72 with a greater degree of isotropy than the etching process for opening the CESL 72). For example, when the CESL 72 is formed of silicon nitride, the etch can be a wet etch, such as a chemical wet etch, and can be performed using one or more etching chemicals such as phosphoric acid ($H_3PO_4$), e.g., a phosphoric acid solution (e.g., $H_3PO_4:H_2O$). The etch can be performed for a long duration, such as a duration in the range of about 10 seconds to about 30 seconds, and at a high temperature, such as a temperature in the range of about 100° C. to about 180° C., which allows the undercuts 94 to extend beneath the first ILD layer 74 by a distance in the range of about 5 nm to about 10 nm. Forming the undercuts 94 of large dimensions helps provide sufficient room for the subsequent formation of the source/drain contacts.

After the undercuts 94 are formed, the etched portions of the epitaxial source/drain regions 70 can have reduced heights. The heights of the epitaxial source/drain regions 70 can be reduced by one or more of the etching processes used to open the CESL 72 (see FIGS. 10A and 10B) and/or form the undercuts 94 (see FIGS. 11A and 11B). For example, the heights of the epitaxial source/drain regions 70 can be reduced by a distance $D_1$, which can be from about 1% to about 6% of the original heights of the epitaxial source/drain regions 70. In some embodiments, the distance $D_1$ can be from about 0.5 nm to about 3 nm. The dimensions (e.g., heights) of the undercuts 94 can thus be increased, helping provide sufficient room for the subsequent formation of source/drain contacts in the undercuts 94.

Figure 12B:
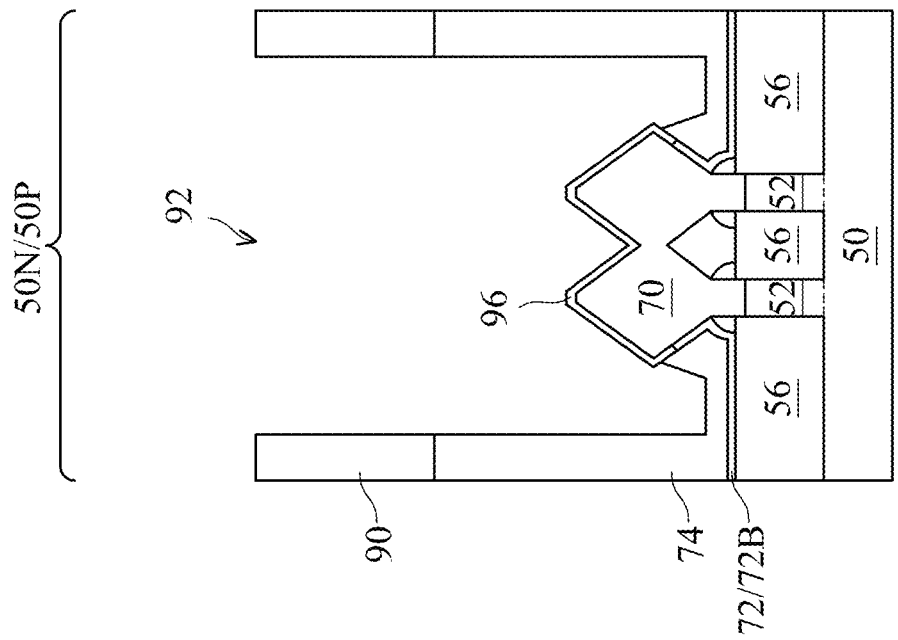
Figure 12A:
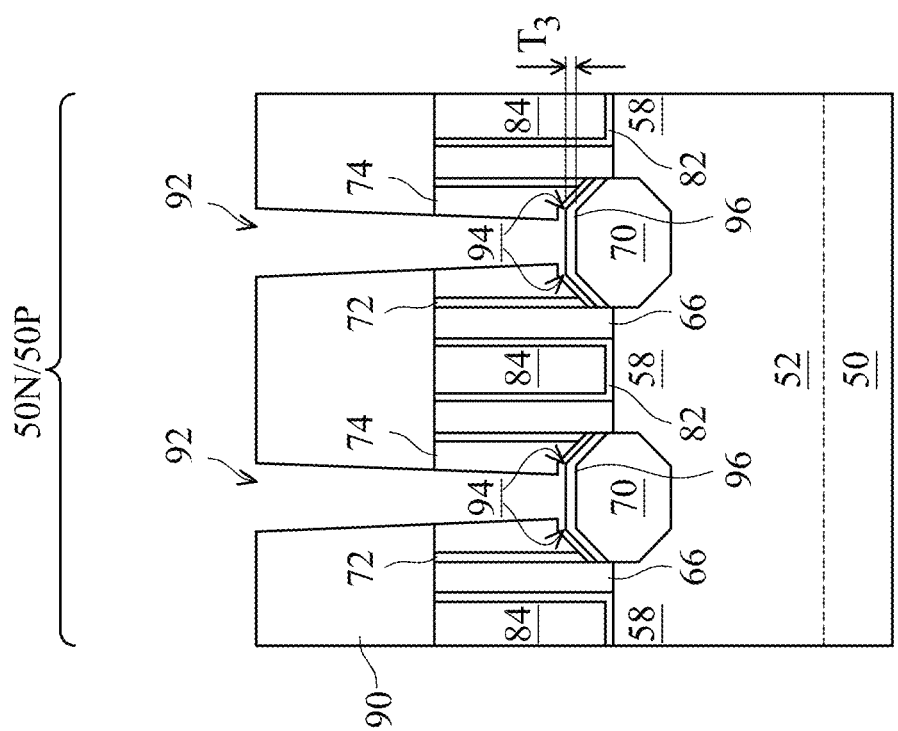

In FIGS. 12A and 12B, silicides 96 are formed in the source/drain contact openings 92 and the undercuts 94, such as on portions of the epitaxial source/drain regions 70 exposed by the source/drain contact openings 92 and the undercuts 94. The silicides 96 can be formed by depositing a metal in the source/drain contact openings 92 and performing an anneal. The metal can be, e.g., titanium, cobalt, nickel, or the like, and can be deposited by, e.g., ALD, CVD, PVD, or the like. The silicides 96 are physically and electrically coupled to the epitaxial source/drain regions 70. As shown by the cross-section of FIG. 12A the silicides 96 contact the portions of the sidewalls of the gate spacers 66 exposed by the undercuts 94. As shown by the cross-section of FIG. 12B, the silicides 96 also contact the bottom surfaces of the epitaxial source/drain regions 70 and the second portions of the CESL 72B exposed by the undercuts 94. Thus, at least some portions of the silicides 96 are disposed between the epitaxial source/drain regions 70 and the first ILD layer 74.

Forming the silicides 96 in the undercuts 94 helps increase the surface area of the epitaxial source/drain regions 70 contacted by the silicides 96. Further, as noted above, the heights of the epitaxial source/drain regions 70 can be reduced by one or more of the etching processes used to open the CESL 72 (see FIGS. 10A and 10B) and/or form the undercuts 94 (see FIGS. 11A and 11B). The silicides 96 can thus have large thicknesses $T_3$. In some embodiments, the thicknesses $T_3$ are in the range of about 2 nm to about 5 nm. In some embodiments, the thicknesses $T_3$ are about 1 nm. Increasing the surface area and the thicknesses of the silicides 96 can help reduce the contact resistance to the epitaxial source/drain regions 70.

Figure 13B:
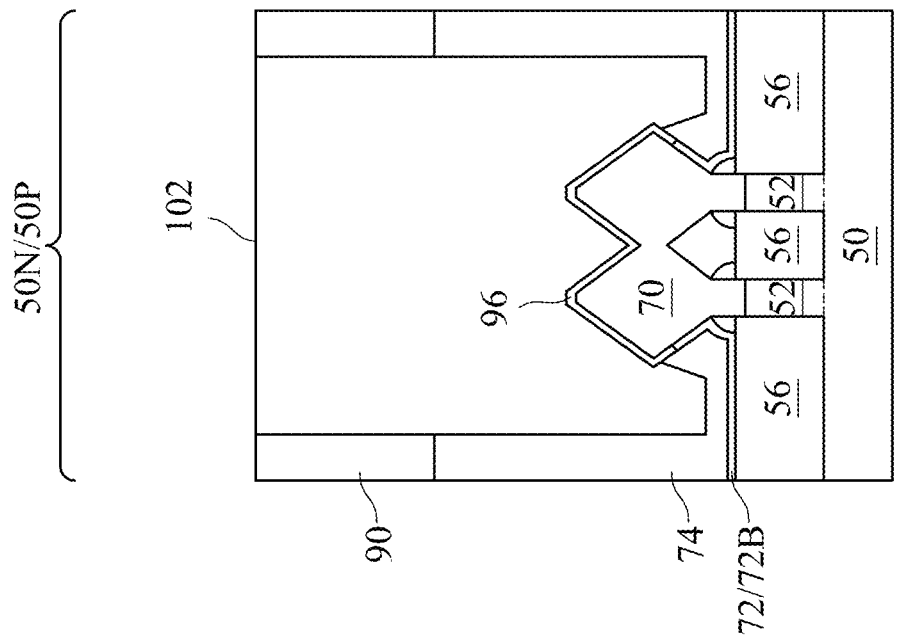
Figure 13A:
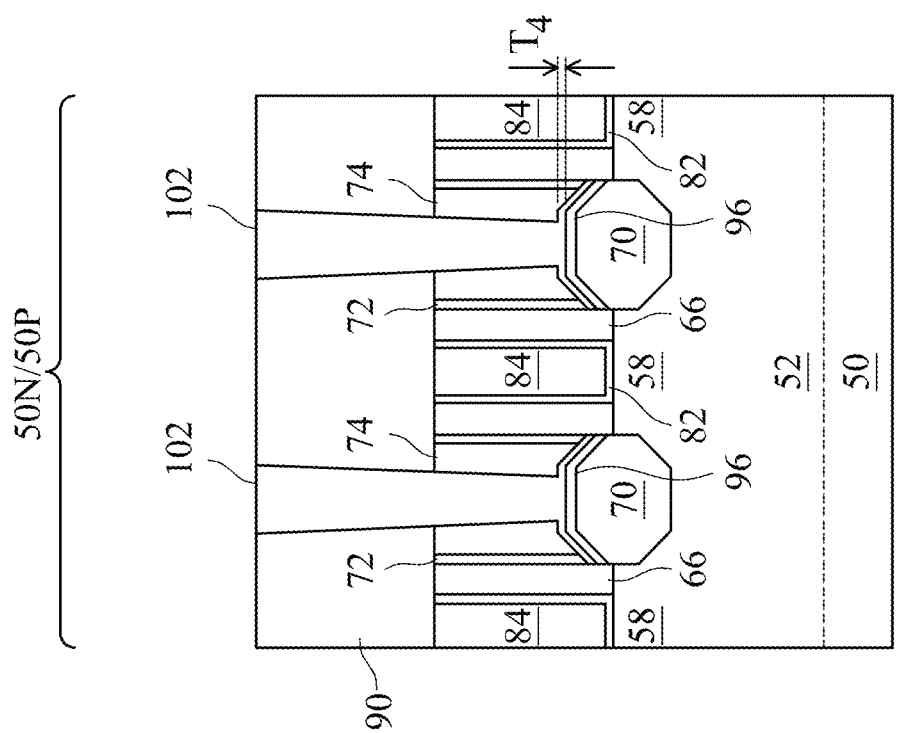

In FIGS. 13A and 13B, source/drain contacts 102 are formed in the source/drain contact openings 92 and the undercuts 94 (see FIG. 12A). A liner, such as a diffusion barrier layer, an adhesion layer, or the like, and a conductive material are formed in the source/drain contact openings 92 and the undercuts 94, on the silicides 96. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 90. The remaining liner and conductive material form the source/drain contacts 102 in the source/drain contact openings 92 and the undercuts 94. The source/drain contacts 102 are physically and electrically coupled to the silicides 96, and thus are connected to the epitaxial source/drain regions 70. After formation, the source/drain contacts 102 extend through the ILD layers 74, 90. As shown by the cross-section of FIG. 13A the source/drain contacts 102 contact portions of the sidewalls of the gate spacers 66, e.g., the portions exposed by the undercuts 94 (see FIG. 12A). Likewise, the source/drain contacts 102 contact the remaining portions of the CESL 72 that extend along sidewalls of the gate spacers 66. Further, the first ILD layer 74 contacts top surfaces of the lower portions of the source/drain contacts 102, and the first ILD layer 74 also surrounds the upper portions of the source/drain contacts 102.

Forming the silicides 96 and the source/drain contacts 102 in the undercuts 94 helps increase the contact surface area of the epitaxial source/drain regions 70. Increasing the contact surface area can help reduce the contact resistance to the epitaxial source/drain regions 70, particularly when the resulting FinFETs are formed at a small technology node. Further, as noted above, the heights of the epitaxial source/drain regions 70 can be reduced by one or more of the etching processes used to open the CESL 72 (see FIGS. 10A and 10B) and/or form the undercuts 94 (see FIGS. 11A and 11B). The portions of the source/drain contacts 102 extending along the surfaces of the epitaxial source/drain regions 70 (e.g., those portions in the undercuts 94) can thus have large thicknesses $T_4$, such as thicknesses $T_4$ in the range of about 1 nm to about 5 nm. Increasing the thicknesses of the source/drain contacts 102 can help reduce the contact resistance to the epitaxial source/drain regions 70. Finally, the parasitic capacitance between the gate electrodes 84 and the source/drain contacts 102 can be reduced. The performance of the FinFETs may thus be improved.

Figures 14A, 14B:
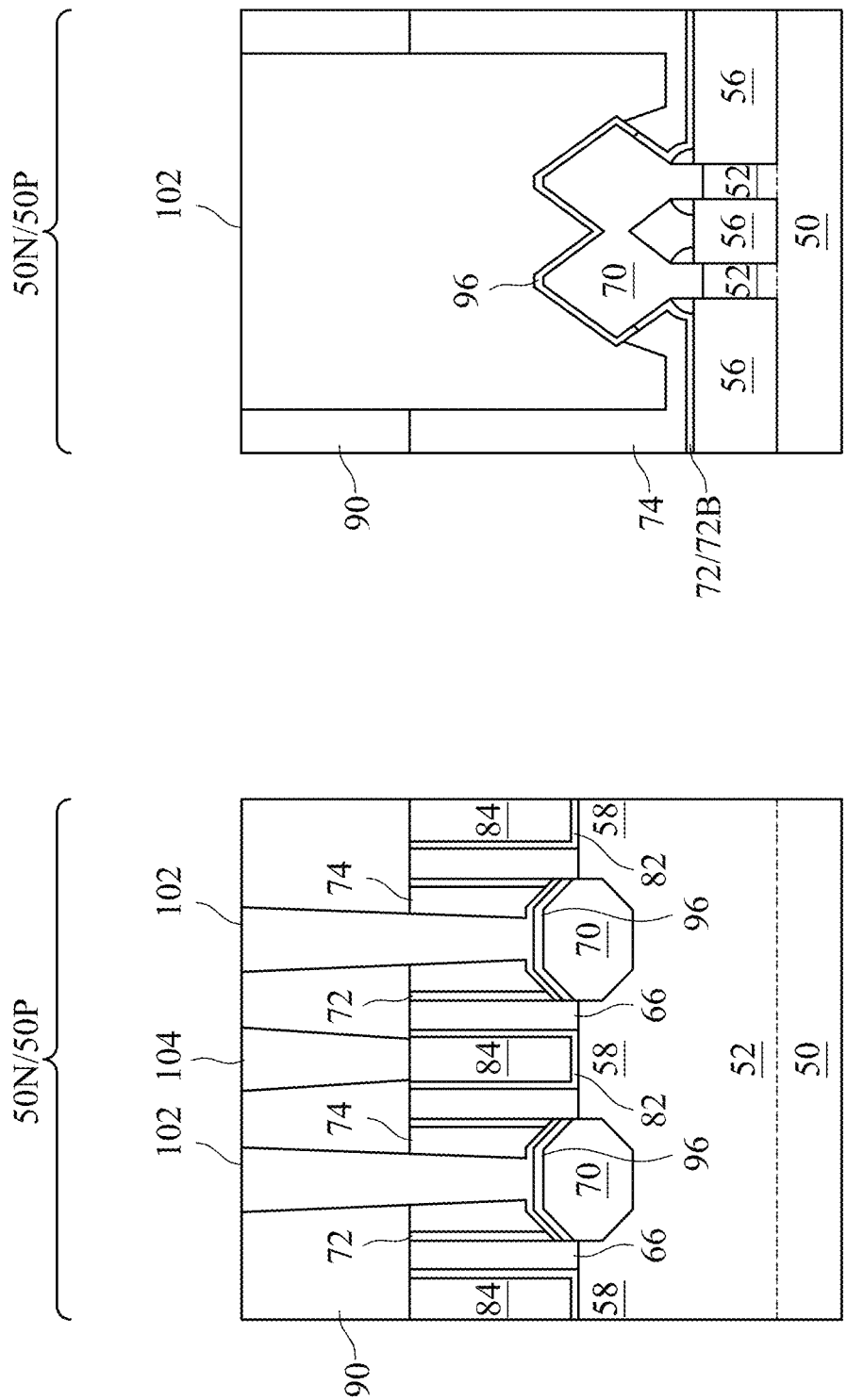

In FIGS. 14A and 14B, gate contacts 104 are formed through the second ILD layer 90. Openings for the gate contacts 104 are formed through the second ILD layer 90. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 90. The remaining liner and conductive material form the gate contacts 104 in the openings. The gate contacts 104 are physically and electrically coupled to, and thus are connected to the gate electrodes 84. The gate contacts 104 can penetrate through gate masks (if present) over the gate electrodes 84.

The ordering of some steps discussed above may be changed in other embodiments. For example, the source/drain contacts 102 and the gate contacts 104 may be formed in different processes, or may be formed in the same process. In some embodiments, the gate contacts 104 are formed simultaneously with the source/drain contacts 102, e.g., the openings for the gate contacts 104 are formed concurrently with the openings for the source/drain contacts 102. The gate electrodes 84 may be substantially unetched by the etching processes used to open the CESL 72 (see FIGS. 10A and 10B) and/or form the undercuts 94 (see FIGS. 11A and 11B). Further, although the source/drain contacts 102 and the gate contacts 104 are illustrated in a same cross-section, each of the source/drain contacts 102 and the gate contacts 104 may be formed in different cross-sections, which may avoid shorting of the contacts.

Figures 15A, 15B:
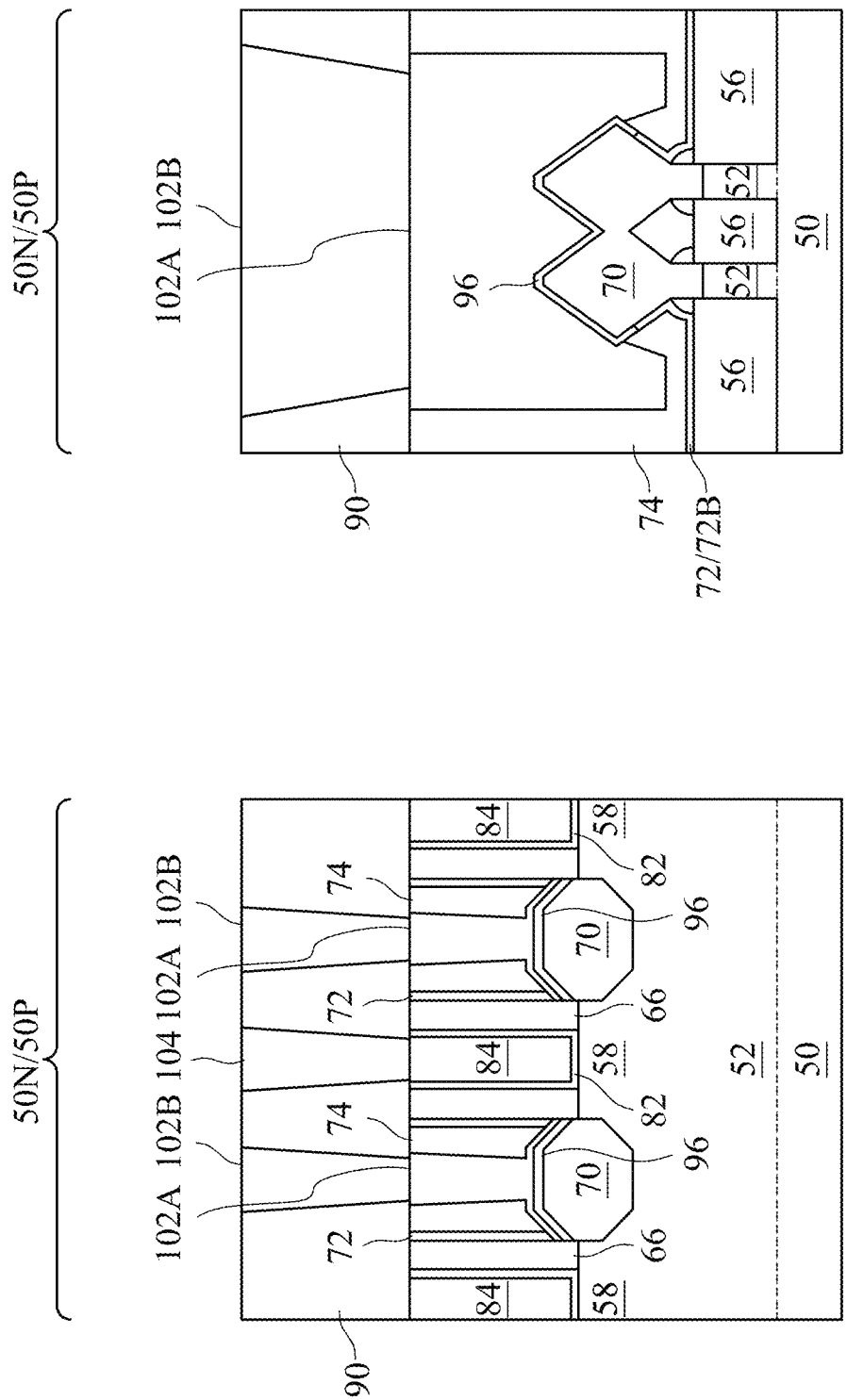
FIGS. 15A and 15B are cross-sectional views FinFETs, in accordance with some other embodiments.

FIGS. 15A and 15B are cross-sectional views of FinFETs, in accordance with some other embodiments. This embodiment is similar to the embodiment described with respect to FIGS. 14A and 14B, except the source/drain contacts 102 include separate lower source/drain contacts 102A and upper source/drain contacts 102B. The lower source/drain contacts 102A extend through the first ILD layer 74 and the upper source/drain contacts 102B extend through the second ILD layer 90. The lower source/drain contacts 102A are thus disposed between the upper source/drain contacts 102B and the silicides 96.

As an example to form the lower source/drain contacts 102A, before forming the second ILD layer 90, openings and undercuts for the lower source/drain contacts 102A can be formed in the first ILD layer 74 and the CESL 72. The openings may be formed using a similar process as that discussed with respect to FIGS. 9A through 11B. The silicides 96 and the lower source/drain contacts 102A are then formed in the openings and undercuts using a similar process as that discussed with respect to FIGS. 12A through 13B. After formation, the top surfaces of the gate spacers 66, the CESL 72, the first ILD layer 74, the gate electrodes 84, and the lower source/drain contacts 102A are coplanar.

As an example to form the upper source/drain contacts 102B, after forming the second ILD layer 90, openings for the upper source/drain contacts 102B are formed through the second ILD layer 90. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD layer 90. The remaining liner and conductive material form the upper source/drain contacts 102B in the openings. The upper source/drain contacts 102B are connected to the lower source/drain contacts 102A, and the lower source/drain contacts 102A are connected to the epitaxial source/drain regions 70. The upper source/drain contacts 102B and gate contacts 104 may be formed in different processes, or may be formed in the same process. After formation, the top surfaces of the second ILD layer 90, the upper source/drain contacts 102B, and the gate contacts 104 are coplanar.

It should be appreciated that some embodiments may combine features from the embodiments illustrated in FIGS. 14A through 15B. For example, source/drain contacts in a first region of a die (e.g., an input/output region) can be continuous conductive features that extend through multiple ILD layers (as shown in FIGS. 14A and 14B), while source/drain contacts in a second region of the die (e.g., a core logic region) can have separate upper and lower conductive features in respective ILD layers (as shown in FIGS. 15A and 15B).

Figures 16A, 16B:
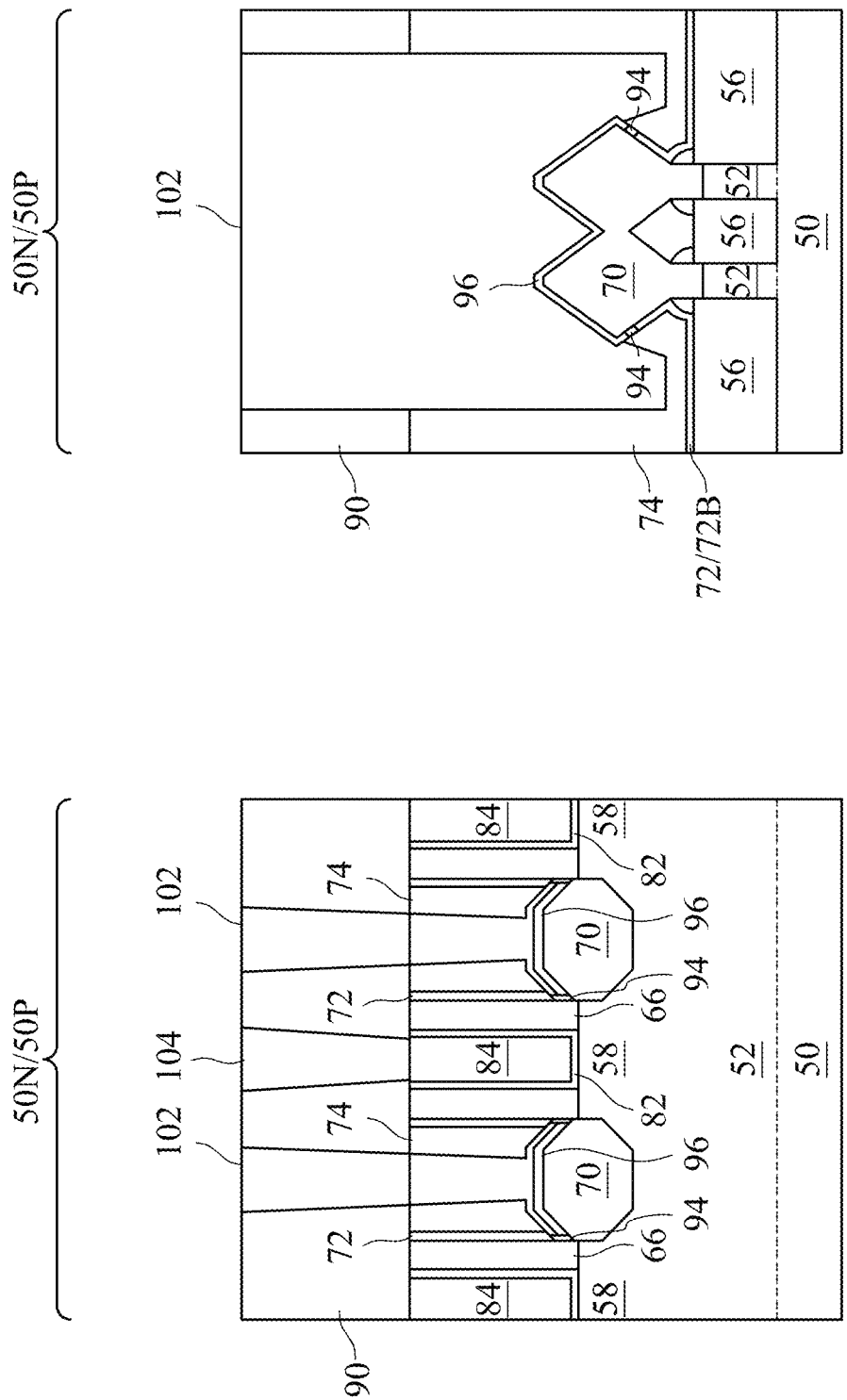
FIGS. 16A and 16B are cross-sectional views FinFETs, in accordance with some other embodiments.

FIGS. 16A and 16B are cross-sectional views of FinFETs, in accordance with some other embodiments. This embodiment is similar to the embodiment described with respect to FIGS. 14A and 14B, except some portions of the undercuts 94 remain after formation of the source/drain contacts 102. Portions of the undercuts 94 can remain when the materials of the silicides 96 and/or the source/drain contacts 102 are formed by a deposition process with low step coverage. For example, when CVD is used to deposit the metal for the silicides 96, some portions of the undercuts 94 may not be filled. As shown by the cross-section of FIG. 16A, some portions of the undercuts 94 can remain between and expose the gate spacers 66 and each of the silicides 96 and the source/drain contacts 102. As shown by the cross-section of FIG. 16B, other portions of the undercuts 94 can remain between and expose the epitaxial source/drain regions 70 and the first ILD layer 74. The undercuts 94 in each cross-section may be continuous or may be discontinuous. The remaining undercuts 94 may be referred to as air gaps or voids. The voids are filled with air, a vacuum, or the like, and thus have a low k value, thereby decreasing the capacitance between the source/drain contacts 102 and the gate electrodes 84.

It should be appreciated that some embodiments may combine features from the embodiments illustrated in FIGS. 14A, 14B, 16A, and 16B. For example, some portions of the undercuts 94 can remain over the epitaxial source/drain regions 70 (see FIG. 16A) while no undercuts remain beneath the epitaxial source/drain regions 70 and the first ILD layer 74 (see FIG. 14B). Likewise, some portions of the undercuts 94 can remain under the epitaxial source/drain regions 70 (see FIG. 16B) while no undercuts remain over the epitaxial source/drain regions 70 and the first ILD layer 74 (see FIG. 14A).

Figures 17A, 17B:
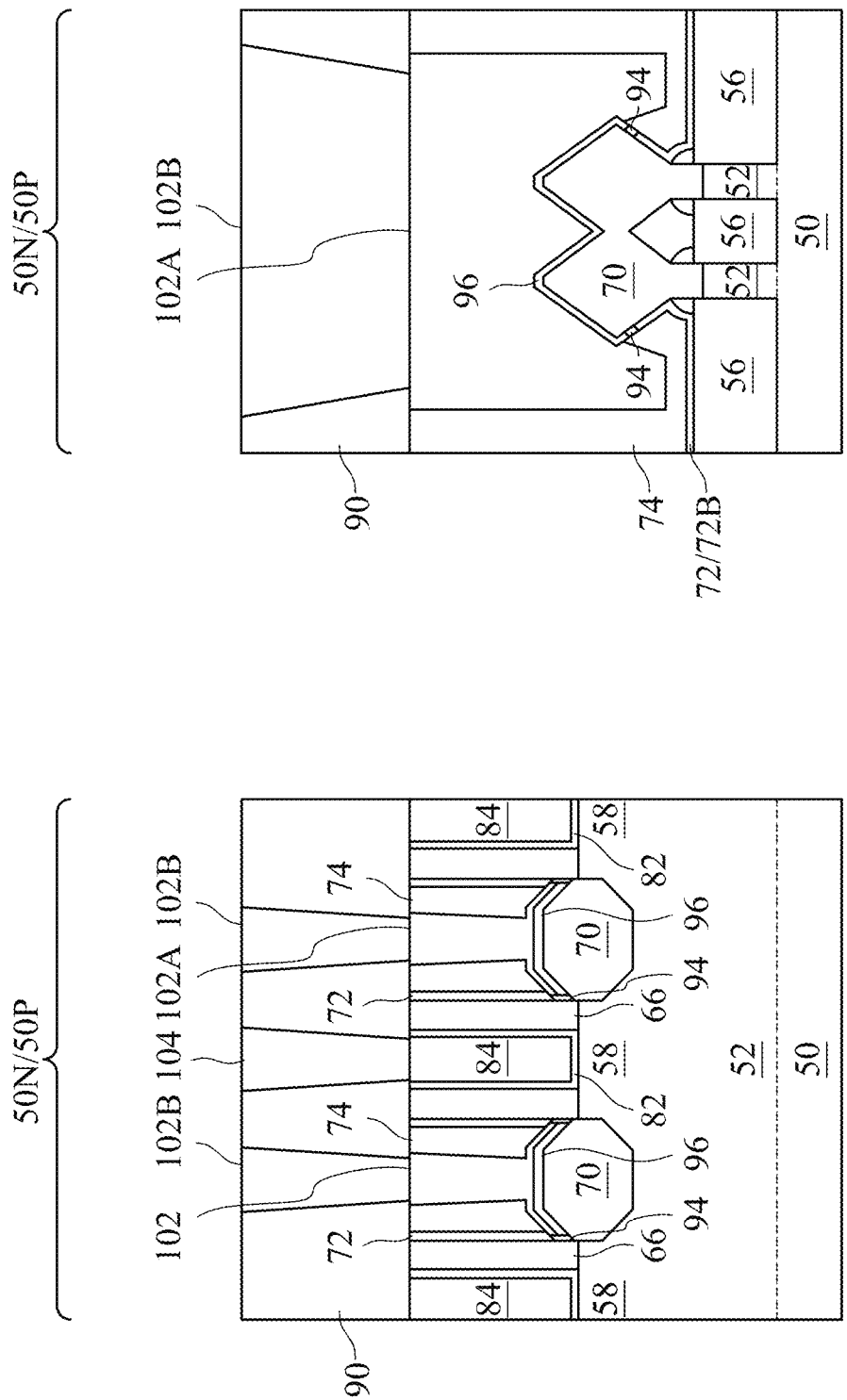
FIGS. 17A and 17B are cross-sectional views FinFETs, in accordance with some other embodiments.

FIGS. 17A and 17B are cross-sectional views of FinFETs, in accordance with some other embodiments. This embodiment is similar to the embodiment described with respect to FIGS. 16A and 16B, except the source/drain contacts 102 include separate lower source/drain contacts 102A and upper source/drain contacts 102B.

FIGS. 18A and 18B are cross-sectional views of FinFETs, in accordance with some other embodiments. This embodiment is similar to the embodiment described with respect to FIGS. 14A and 14B, except the silicides 96 contact less surface area of the epitaxial source/drain regions 70. Referring back to FIGS. 11A and 11B, the silicides 96 can be formed to contact less surface area of the epitaxial source/drain regions 70 by reducing the dimensions of the undercuts 94. Specifically, the undercuts 94 can be formed to extend beneath the first ILD layer 74 by a lesser distance, such that the undercuts 94 do not expose portions of the sidewalls of the gate spacers 66, and such that portions of the CESL 72 remain between the first ILD layer 74 and the epitaxial source/drain regions 70. Thus, sidewalls of the CESL 72 over the epitaxial source/drain regions 70 are exposed by the undercuts 94. The widths of the undercuts 94 can be reduced by varying the parameters of the etch used to form the undercuts 94. For example, the etch can be performed for a shorter duration, such as a duration in the range of about 2 seconds to about 10 seconds, or at a lower temperature, such as a temperature in the range of about 25° C. to about 100° C., which allows the undercuts 94 to extend beneath the first ILD layer 74 by a distance in the range of about 1 nm to about 5 nm. Forming the undercuts 94 of smaller dimensions helps reduce manufacturing costs of the FinFETs.

Figures 19A, 19B:
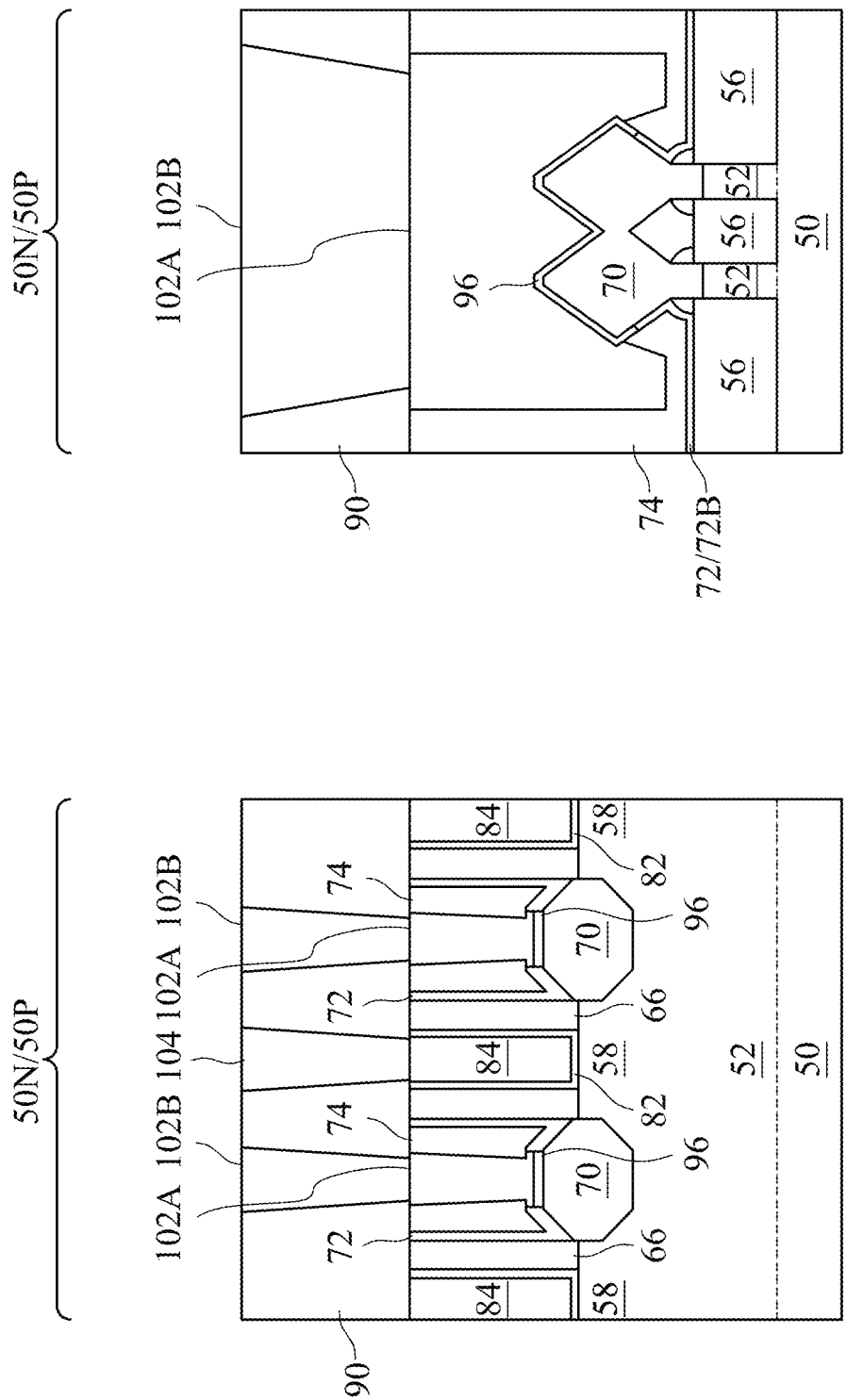
FIGS. 19A and 19B are cross-sectional views FinFETs, in accordance with some other embodiments.

FIGS. 19A and 19B are cross-sectional views of FinFETs, in accordance with some other embodiments. This embodiment is similar to the embodiment described with respect to FIGS. 18A and 18B, except the source/drain contacts 102 include separate lower source/drain contacts 102A and upper source/drain contacts 102B.

Figure 20B:
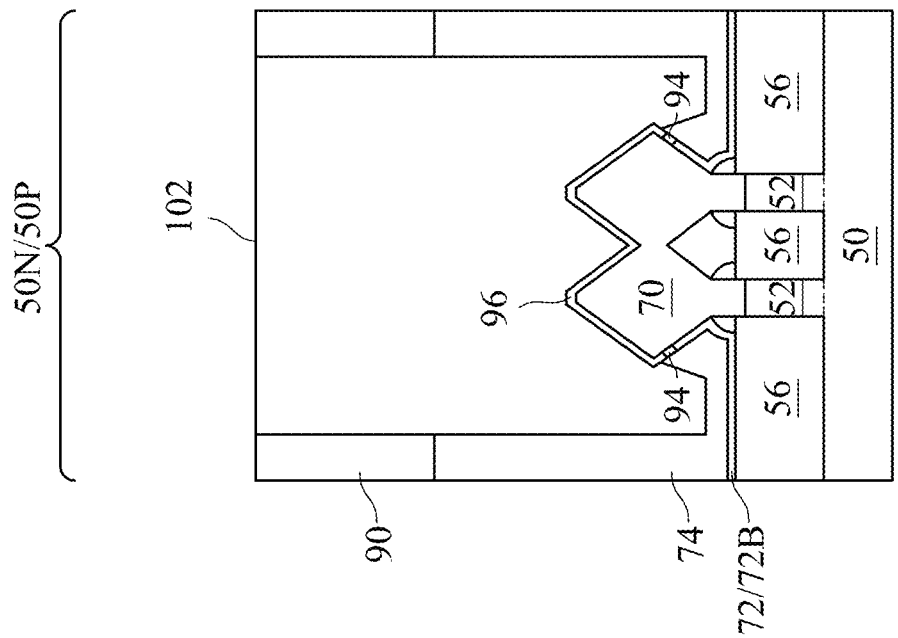
FIGS. 20A and 20B are cross-sectional views FinFETs, in accordance with some other embodiments.
Figure 20A:
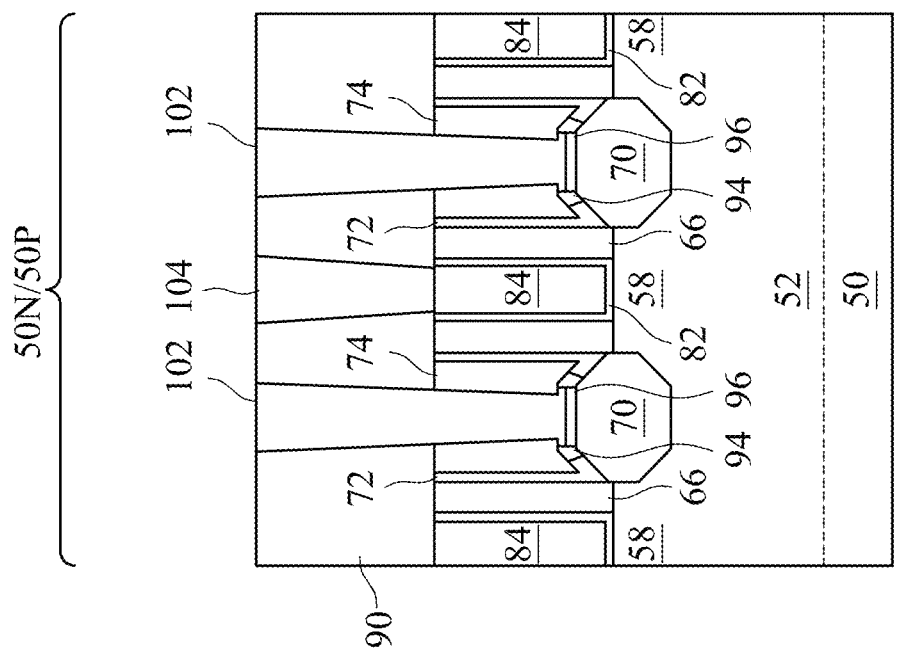

FIGS. 20A and 20B are cross-sectional views of FinFETs, in accordance with some other embodiments. This embodiment is similar to the embodiment described with respect to FIGS. 19A and 19B, except some portions of the undercuts 94 remain after formation of the source/drain contacts 102. Portions of the undercuts 94 can remain when the materials of the silicides 96 and/or the source/drain contacts 102 are formed by a deposition process with low step coverage. For example, when CVD is used to deposit the metal for the silicides 96, some portions of the undercuts 94 may not be filled. As shown by the cross-section of FIG. 20A, the undercuts 94 can remain between the CESL 72 and each of the silicides 96 and the source/drain contacts 102. As shown by the cross-section of FIG. 20B, the undercuts 94 can remain between the epitaxial source/drain regions 70 and the first ILD layer 74.

It should be appreciated that some embodiments may combine features from the embodiments illustrated in FIGS. 18A, 18B, 20A, and 20B. For example, some portions of the undercuts 94 can remain over the epitaxial source/drain regions 70 (see FIG. 20A) while no undercuts remain beneath the epitaxial source/drain regions 70 and the first ILD layer 74 (see FIG. 18B). Likewise, some portions of the undercuts 94 can remain under the epitaxial source/drain regions 70 (see FIG. 20B) while no undercuts remain over the epitaxial source/drain regions 70 and the first ILD layer 74 (see FIG. 18A).

FIGS. 21A and 21B are cross-sectional views of FinFETs, in accordance with some other embodiments. This embodiment is similar to the embodiment described with respect to FIGS. 20A and 20B, except the source/drain contacts 102 include separate lower source/drain contacts 102A and upper source/drain contacts 102B.

Embodiments may achieve advantages. Forming the undercuts 94 allows the silicides 96 and the source/drain contacts 102 to contact more surface area of the epitaxial source/drain regions 70. Increasing the contact surface area can help reduce the contact resistance to the epitaxial source/drain regions 70, particularly when the resulting FinFETs are formed at a small technology node. Further, forming the undercuts 94 allows the thicknesses of the silicides 96 and the portions of the source/drain contacts 102 in the undercuts 94 to be increased. Increasing the thicknesses of the silicides 96 and the source/drain contacts 102 can help reduce the contact resistance to the epitaxial source/drain regions 70. Finally, by reducing the amount of dielectric material around the epitaxial source/drain regions 70, the parasitic capacitance between the gate electrodes 84 and the source/drain contacts 102 can be reduced. The performance of the FinFETs may thus be improved.

In an embodiment, a structure includes: a gate stack over a channel region of a substrate; a source/drain region adjacent the channel region; a first inter-layer dielectric (ILD) layer over the source/drain region; a silicide between the first ILD layer and the source/drain region, the silicide contacting a top surface of the source/drain region and a bottom surface of the source/drain region; and a first source/drain contact having a first portion and a second portion, the first portion of the first source/drain contact disposed between the silicide and the first ILD layer, the second portion of the first source/drain contact extending through the first ILD layer and contacting the silicide.

In some embodiments, the structure further includes: a gate spacer separating the source/drain region from the gate stack, a sidewall of the gate spacer contacting the silicide and the first source/drain contact; and a contact etch stop layer (CESL) extending along the sidewall of the gate spacer, the CESL contacting the first source/drain contact. In some embodiments, the structure further includes: a gate spacer separating the source/drain region from the gate stack; a contact etch stop layer (CESL) extending along a sidewall of the gate spacer; and a void between the CESL and the source/drain region, the void exposing surfaces of the gate spacer, the silicide, and the first source/drain contact. In some embodiments, the structure further includes: a gate spacer separating the source/drain region from the gate stack; and a contact etch stop layer (CESL) extending along a sidewall of the gate spacer and the top surface of the source/drain region, the CESL contacting the silicide and the first source/drain contact. In some embodiments, the structure further includes: a gate spacer separating the source/drain region from the gate stack; a contact etch stop layer (CESL) extending along a sidewall of the gate spacer and the top surface of the source/drain region; and a void between the first ILD layer and the source/drain region, the void exposing surfaces of the CESL, the silicide, and the first source/drain contact. In some embodiments, the structure further includes: a second ILD layer on the first ILD layer; a second source/drain contact extending through the second ILD layer, the second source/drain contact contacting the first source/drain contact; and a gate contact extending through the second ILD layer, the gate contact contacting the gate stack, where top surfaces of the first ILD layer, the first source/drain contact, and the gate stack are coplanar, and where top surfaces of the second ILD layer, the second source/drain contact, and the gate contact are coplanar. In some embodiments, the structure further includes: a second ILD layer on the first ILD layer, the first source/drain contact extending through the second ILD layer; and a gate contact extending through the second ILD layer, the gate contact contacting the gate stack, where top surfaces of the second ILD layer, the first source/drain contact, and the gate contact are coplanar.

In an embodiment, a structure includes: a gate stack on a substrate; a gate spacer adjacent the gate stack; a source/drain region adjacent the gate spacer; a silicide on the source/drain region, the silicide contacting a sidewall of the gate spacer; a source/drain contact on the silicide, the source/drain contact contacting the sidewall of the gate spacer; and an inter-layer dielectric (ILD) layer on a lower portion of the source/drain contact, the ILD layer surrounding an upper portion of the source/drain contact.

In some embodiments, the structure further includes: a contact etch stop layer (CESL) contacting a top surface of the source/drain contact, the sidewall of the gate spacer, and a sidewall of the ILD layer. In some embodiments of the structure, the silicide has a first portion and a second portion, the first portion disposed between the source/drain contact and a top surface of the source/drain region, the second portion disposed between the ILD layer and a bottom surface of the source/drain region. In some embodiments, the structure further includes: a void exposing the bottom surface of the source/drain region, a surface of the ILD layer, and a surface of the silicide.

In an embodiment, a method includes: depositing a contact etch stop layer (CESL) over a source/drain region; depositing an inter-layer dielectric (ILD) layer over the CESL; etching an opening in the ILD layer; extending the opening through the CESL with a first etching process, the first etching process being anisotropic; widening a lower portion of the opening with a second etching process to form an undercut between the ILD layer and the source/drain region, the second etching process being isotropic; forming a silicide in the opening and the undercut, the silicide contacting the source/drain region; and forming a source/drain contact in the opening and the undercut, the source/drain contact contacting the silicide.

In some embodiments, the method further includes: forming a gate spacer adjacent to the source/drain region, where the undercut exposes a sidewall of the gate spacer after the widening the lower portion of the opening. In some embodiments of the method, after forming the source/drain contact and the silicide, the sidewall of the gate spacer contacts each of the source/drain contact and the silicide. In some embodiments of the method, after forming the source/drain contact and the silicide, a portion of the undercut remains between the sidewall of the gate spacer and each of the source/drain contact and the silicide. In some embodiments of the method, the CESL is formed of silicon nitride, the ILD layer is formed of silicon oxide, the first etching process is a dry etch performed using fluoromethane, and the second etching process is a wet etch performed using phosphoric acid, where the second etching process is performed for a duration in a range of 10 seconds to 30 seconds, and at a temperature in a range of 100° C. to 180° C. In some embodiments of the method, the undercut exposes a sidewall of the CESL after the widening the lower portion of the opening. In some embodiments of the method, after forming the source/drain contact and the silicide, the sidewall of the CESL contacts each of the source/drain contact and the silicide. In some embodiments of the method, after forming the source/drain contact and the silicide, a portion of the undercut remains between the sidewall of the CESL and each of the source/drain contact and the silicide. In some embodiments of the method, the CESL is formed of silicon nitride, the ILD layer is formed of silicon oxide, the first etching process is a dry etch performed using fluoromethane, and the second etching process is a wet etch performed using phosphoric acid, where the second etching process is performed for a duration in a range of 2 seconds to 10 seconds, and at a temperature in a range of 25° C. to 100° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
a channel region;
a source/drain region adjacent the channel region;
an inter-layer dielectric over the source/drain region;
a silicide between the inter-layer dielectric and the source/drain region, the silicide contacting an upper facet of the source/drain region and a lower facet of the source/drain region;
a source/drain contact having a first portion in contact with the silicide and having a second portion extending through the inter-layer dielectric, the first portion of the source/drain contact disposed between the silicide and the inter-layer dielectric; and
a void exposing the upper facet of the source/drain region or the lower facet of the source/drain region.

2. The device of claim 1, wherein the inter-layer dielectric is separated from the upper facet of the source/drain region by the void.

3. The device of claim 1, wherein the inter-layer dielectric is separated from the lower facet of the source/drain region by the void.

4. The device of claim 1, further comprising:
a gate structure over the channel region; and
a spacer between the gate structure and the source/drain region, the silicide being in contact with the spacer.

5. The device of claim 1, further comprising:
a gate structure over the channel region; and
a spacer between the gate structure and the source/drain region, the silicide separated from the spacer by the void.

6. The device of claim 1, wherein the first portion of the source/drain contact is wider than the second portion of the source/drain contact.

7. The device of claim 1, further comprising:
an isolation region;
a semiconductor fin extending above the isolation region, the semiconductor fin comprising the channel region; and
a gate structure extending along a sidewall of the semiconductor fin and a top surface of the isolation region.

8. The device of claim 1, further comprising:
a dielectric layer between the inter-layer dielectric and the source/drain region, the silicide extending through the dielectric layer.

9. A device comprising:
a gate structure over a substrate;
a gate spacer adjacent the gate structure;
a source/drain region adjacent the gate spacer;
a silicide over upper facets of the source/drain region, the silicide contacting a sidewall of the gate spacer;
a source/drain contact over the silicide, the source/drain contact contacting the sidewall of the gate spacer; and
an inter-layer dielectric over a lower portion of the source/drain contact, the inter-layer dielectric surrounding an upper portion of the source/drain contact, the lower portion of the source/drain contact disposed between the inter-layer dielectric and the upper facets of the source/drain region.

10. The device of claim 9, further comprising:
a void between the inter-layer dielectric and lower facets of the source/drain region.

11. The device of claim 9, further comprising:
an isolation region over the substrate; and
a semiconductor fin extending above the isolation region, the gate structure extending along a sidewall of the semiconductor fin.

12. The device of claim 11, further comprising:
a dielectric layer between the isolation region and a portion of the inter-layer dielectric, the dielectric layer comprising a different dielectric material than the inter-layer dielectric, the portion of the inter-layer dielectric disposed between the dielectric layer and the source/drain contact.

13. The device of claim 12, wherein the dielectric layer and the inter-layer dielectric each contact the lower portion of the source/drain contact.

14. The device of claim 12, wherein the dielectric layer is thicker than the lower portion of the source/drain contact.

15. A device comprising:
a channel region;
a source/drain region adjacent the channel region, the source/drain region having upper facets and lower facets;
a dielectric layer on the upper facets and the lower facets of the source/drain region;
a silicide extending through the dielectric layer, the silicide contacting the upper facets and the lower facets of the source/drain region;
an inter-layer dielectric on the silicide, the dielectric layer comprising a different dielectric material than the inter-layer dielectric; and
a source/drain contact extending through the inter-layer dielectric and contacting the silicide.

16. The device of claim 15, wherein the silicide is in contact with the dielectric layer.

17. The device of claim 15, wherein the silicide is separated from the dielectric layer by a void.

18. The device of claim 15, further comprising:
an isolation region; and
a semiconductor fin extending above the isolation region, the semiconductor fin comprising the channel region.

19. The device of claim 15, wherein a lower portion of the source/drain contact is disposed between the silicide and the inter-layer dielectric, the dielectric layer being thicker than the lower portion of the source/drain contact.

20. The device of claim 19, wherein an upper portion of the source/drain contact extends through the inter-layer dielectric, the lower portion of the source/drain contact being wider than the upper portion of the source/drain contact.

\* \* \* \* \*